(12) United States Patent
Kurokawa

(10) Patent No.: US 10,276,107 B2
(45) Date of Patent: Apr. 30, 2019

(54) SEMICONDUCTOR DEVICE, DISPLAY DEVICE, AND ELECTRONIC DEVICE

(71) Applicant: Semiconductor Energy Laboratory Co., Ltd., Kanagawa-ken (JP)

(72) Inventor: Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/594,949

(22) Filed: May 15, 2017

(65) Prior Publication Data

US 2017/0337884 A1 Nov. 23, 2017

(30) Foreign Application Priority Data

May 20, 2016 (JP) .................................. 2016-101813
Dec. 7, 2016 (JP) .................................. 2016-237312

(51) Int. Cl.
*G09G 3/34* (2006.01)
*G09G 3/36* (2006.01)
(Continued)

(52) U.S. Cl.
CPC ........... *G09G 3/3413* (2013.01); *G02F 1/136* (2013.01); *G09G 3/2092* (2013.01); *G09G 3/367* (2013.01); *G09G 3/3629* (2013.01); *G09G 3/3648* (2013.01); *H01L 29/772* (2013.01); *G09G 2300/046* (2013.01); *G09G 2300/0426* (2013.01); *G09G 2300/0439* (2013.01);
(Continued)

(58) Field of Classification Search
CPC .... G09G 3/3413; G09G 3/3629; G09G 3/367; G02F 1/136; H01L 29/772

USPC ................................................ 326/37–41, 47
See application file for complete search history.

(56) References Cited

U.S. PATENT DOCUMENTS 8,879,010 B2 * 11/2014 Yamazaki ........... G02F 1/13624
257/59
9,269,725 B2 * 2/2016 Yamazaki ........... H01L 27/1225
(Continued)

FOREIGN PATENT DOCUMENTS

CN          001403856 A       3/2003
CN          101359442 A       2/2009
(Continued)

OTHER PUBLICATIONS

International Search Report re Application No. PCT/IB2017/052713, dated Aug. 29, 2017.
(Continued)

*Primary Examiner* — Dylan C White
(74) *Attorney, Agent, or Firm* — Husch Blackwell LLP

(57) ABSTRACT

A semiconductor device with low power consumption is provided. The semiconductor device includes a controller, a register, and an image processing portion. The image processing portion has a function of processing image data using a parameter. The image processing portion takes the image data from a frame memory and takes the parameter from the register. The frame memory has a function of retaining the image data while power supply is stopped. The register has a function of retaining the parameter while power supply is stopped. The controller has a function of controlling power supply to the register, the frame memory, and the image processing portion.

17 Claims, 31 Drawing Sheets

(51) Int. Cl.
*G09G 3/20* (2006.01)
*G02F 1/136* (2006.01)
*H01L 29/772* (2006.01)

(52) U.S. Cl.
CPC ............ *G09G 2300/0857* (2013.01); *G09G 2310/0275* (2013.01); *G09G 2310/08* (2013.01); *G09G 2330/021* (2013.01); *G09G 2360/121* (2013.01); *G09G 2370/08* (2013.01)

(56) References Cited

U.S. PATENT DOCUMENTS

| | | | |
|---|---|---|---|
| 2003/0052869 A1 | 3/2003 | Fujii et al. | |
| 2009/0033645 A1* | 2/2009 | Araya | G09G 3/3648 345/205 |
| 2010/0149138 A1 | 6/2010 | Lee et al. | |
| 2011/0090183 A1 | 4/2011 | Yamazaki et al. | |
| 2011/0090207 A1 | 4/2011 | Yamazaki et al. | |
| 2011/0156027 A1 | 6/2011 | Yamazaki et al. | |
| 2011/0161574 A1* | 6/2011 | Minami | G09G 5/18 711/104 |
| 2013/0134416 A1* | 5/2013 | Nishijima | H01L 33/16 257/43 |
| 2013/0235689 A1 | 9/2013 | Koyama | |
| 2013/0256657 A1 | 10/2013 | Yamazaki et al. | |
| 2014/0002425 A1 | 1/2014 | Hirakata et al. | |
| 2014/0068300 A1 | 3/2014 | Nishijima et al. | |
| 2014/0108836 A1 | 4/2014 | Nishijima et al. | |
| 2014/0208142 A1 | 7/2014 | Tamura | |
| 2014/0285505 A1* | 9/2014 | Nakanishi | G06T 1/20 345/545 |
| 2014/0368417 A1 | 12/2014 | Yamazaki et al. | |
| 2015/0070254 A1 | 3/2015 | Yamazaki et al. | |
| 2016/0035275 A1 | 2/2016 | Yamazaki et al. | |
| 2016/0070386 A1 | 3/2016 | Yamamoto et al. | |
| 2016/0232868 A1 | 8/2016 | Yamazaki et al. | |
| 2016/0260718 A1 | 9/2016 | Yamazaki et al. | |
| 2017/0004788 A1 | 1/2017 | Yamazaki et al. | |
| 2017/0177116 A1 | 6/2017 | Jinbo et al. | |
| 2017/0300261 A1 | 10/2017 | Kurokawa | |
| 2017/0337866 A1 | 11/2017 | Ikeda et al. | |
| 2017/0365209 A1 | 12/2017 | Kurokawa | |
| 2018/0018656 A1* | 1/2018 | Goldberg | G06Q 20/34 |

FOREIGN PATENT DOCUMENTS

| | | |
|---|---|---|
| JP | 2003-157026 A | 5/2003 |
| JP | 2009-037074 A | 2/2009 |
| JP | 2011-133651 A | 7/2011 |
| JP | 2011-141522 A | 7/2011 |
| JP | 2011-141524 A | 7/2011 |
| JP | 2011-151383 A | 8/2011 |
| JP | 2013-137532 A | 7/2013 |
| JP | 2013-213912 A | 10/2013 |
| JP | 2016-024346 A | 2/2016 |
| KR | 2003-0022049 A | 3/2003 |
| KR | 2014-0096330 A | 8/2014 |
| TW | 201329947 | 7/2013 |

OTHER PUBLICATIONS

Written Opinion re Application No. PCT/IB2017/052713, dated Aug. 29, 2017.

* cited by examiner

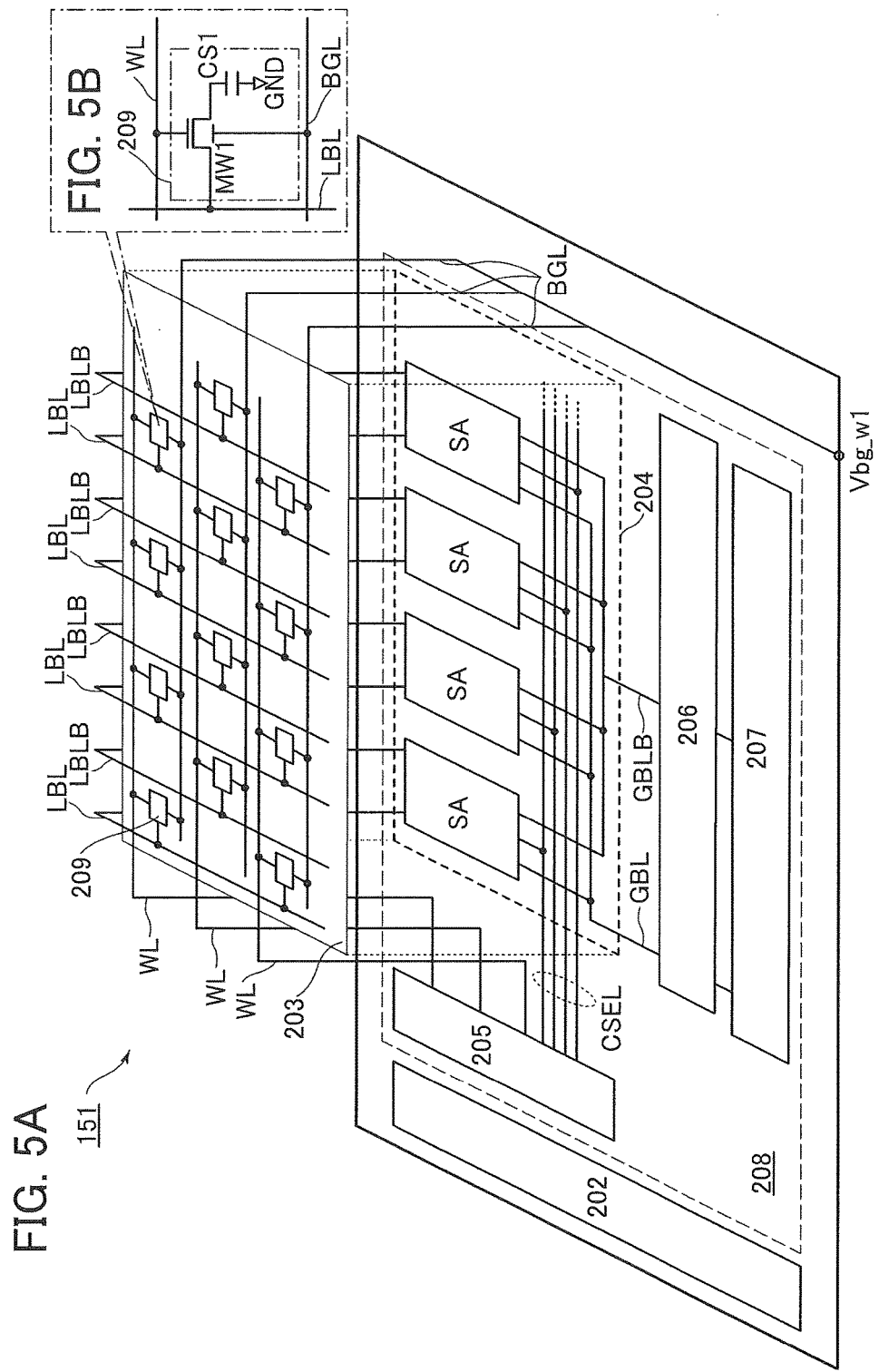

SEMICONDUCTOR DEVICE, DISPLAY DEVICE, AND ELECTRONIC DEVICE

TECHNICAL FIELD

One embodiment of the present invention relates to a semiconductor device.

Note that one embodiment of the present invention is not limited to the above technical fields. The technical fields of the invention disclosed in this specification and the like relate to an object, a method, or a manufacturing method. Furthermore, one embodiment of the present invention relates to a process, a machine, manufacture, or a composition of matter.

Specifically, examples of the technical field of one embodiment of the present invention disclosed in this specification and the like include a semiconductor device, a display device, an electronic device, a method for driving any of them, and a method for manufacturing any of them. In this specification and the like, a semiconductor device generally means a device that can function by utilizing semiconductor characteristics.

BACKGROUND ART

A display device in which a reflection type element and a light emission type element are combined has been proposed (Patent Document 1). The reflection type element is used in bright environments and the light emission type element is used in dark environments, so that it is possible to achieve high display quality independent of environment light and to provide a low power consumption display device.

A technique for using an oxide semiconductor transistor (hereinafter referred to as an OS transistor) for a display device such as a liquid crystal display or an organic electroluminescent (EL) display has been proposed. The refresh frequency at the time of displaying still images is reduced because an OS transistor has an extremely low off-state current, resulting in reduction in power consumption of liquid crystal displays or organic EL displays. Such a technique has been disclosed (Patent Document 2 and Patent Document 3). Note that the above-described technique for reducing the power consumption of the display device is referred to as idling stop or IDS driving in this specification.

An example in which an OS transistor, which has an extremely low off-state current, is used in a nonvolatile memory device has been disclosed (Patent Document 4).

REFERENCE

Patent Documents

[Patent Document 1] Japanese Published Patent Application No. 2003-157026
[Patent Document 2] Japanese Published Patent Application No. 2011-141522
[Patent Document 3] Japanese Published Patent Application No. 2011-141524
[Patent Document 4] Japanese Published Patent Application No. 2011-151383

DISCLOSURE OF INVENTION

To perform display using the reflection type element in bright environments and the light emission type element in dark environments, a semiconductor device which distributes image data to each display element by detecting external light is necessary. The semiconductor device does not need to transmit image data or a signal to a display device while the display device performs IDS driving; thus, power supply for circuits relating to the transmission can be stopped. An object of one embodiment of the present invention is to provide a semiconductor device which has low power consumption and a mechanism in which display quality is not influenced even when power supply for some circuits is stopped.

An object of one embodiment of the present invention is to provide a novel semiconductor device. Another object of one embodiment of the present invention is to provide a novel semiconductor device with low power consumption. Another object of one embodiment of the present invention is to provide a display device including the novel semiconductor device. Another object of one embodiment of the present invention is to provide an electronic device using the display device including the novel semiconductor device.

One embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

One embodiment of the present invention is a semiconductor device including a first controller, a register, a frame memory, and an image processing portion. The frame memory is configured to store image data. The image processing portion is configured to process the image data. The register is configured to store a parameter for performing processing in the image processing portion. The frame memory is configured to retain the image data while power supply to the frame memory is stopped. The register is configured to retain the parameter while power supply to the register is stopped. The first controller is configured to control power supply to the register, the frame memory, and the image processing portion.

One embodiment of the present invention is the semiconductor device according to the above embodiment in which the register includes a scan chain register, a first register, and a second register. The scan chain register includes a third register and a fourth register. The third register includes a first retention circuit. The fourth register includes a second retention circuit. An output terminal of the third register is electrically connected to an input terminal of the fourth register. The first register is configured to read data stored in the third register. The second register is configured to read data stored in the fourth register. The data read by the first register and the second register are output to the image processing portion as the parameter. The first retention circuit is configured to store the data of the third register. The third register is configured to read the data stored in the first retention circuit. The second retention circuit is configured to store the data of the fourth register. The fourth register is configured to read the data stored in the second retention circuit. The first retention circuit and the second retention circuit are configured to retain stored data while power supply to the register is stopped.

One embodiment of the present invention is the semiconductor device according to the above embodiment in which the first retention circuit includes a first transistor and a first capacitor and the second retention circuit includes a second transistor and a second capacitor. The first transistor controls charge and discharge of the first capacitor. The second transistor controls charge and discharge of the second capacitor. The first transistor and the second transistor each include an oxide semiconductor in a channel formation region.

One embodiment of the present invention is the semiconductor device according to the above embodiment in which the frame memory includes a plurality of memory cells and the memory cells each include a third transistor and a third capacitor. The third transistor controls charge and discharge of the third capacitor. The third transistor includes an oxide semiconductor in a channel formation region.

One embodiment of the present invention is the semiconductor device according to the above embodiment further including a second controller. The second controller is configured to generate a timing signal. The register is configured to store a parameter for generating the timing signal of the second controller.

One embodiment of the present invention is the semiconductor device according to the above embodiment in which the first controller is configured to control power supply to the second controller.

One embodiment of the present invention is the semiconductor device according to the above embodiment further including a third controller. The third controller is configured to receive a first signal from an optical sensor and to generate a second signal for performing processing in the image processing portion on the basis of the first signal.

One embodiment of the present invention is the semiconductor device according to the above embodiment when image data and a parameter are not input from an external device, which is configured to generate a third signal for displaying a still image on the basis of the image data stored in the frame memory and the parameter stored in the register.

One embodiment of the present invention is the semiconductor device according to the above embodiment further including a source driver. The source driver is configured to generate a data signal on the basis of the image data processed in the image processing portion.

One embodiment of the present invention is the semiconductor device according to the above embodiment further including a source driver. The source driver is configured to generate a first data signal or a second data signal on the basis of the image data processed in the image processing portion. The first data signal is configured to drive a reflective element. The second data signal is configured to drive a light-emitting element.

One embodiment of the present invention is the semiconductor device according to the above embodiment in which the first controller is configured to control power supply to the source driver.

One embodiment of the present invention can provide a novel semiconductor device. One embodiment of the present invention can provide a novel semiconductor device with low power consumption.

One embodiment of the present invention can provide a display device including the novel semiconductor device. One embodiment of the present invention can provide an electronic device using the display device including the novel semiconductor device.

Note that the effects of one embodiment of the present invention are not limited to the above effects. The above effects do not disturb the existence of other effects. The other effects are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF DRAWINGS

FIGS. 5A and 5B are block diagrams illustrating a configuration example of a frame memory.

BEST MODE FOR CARRYING OUT THE INVENTION

Figure 1:
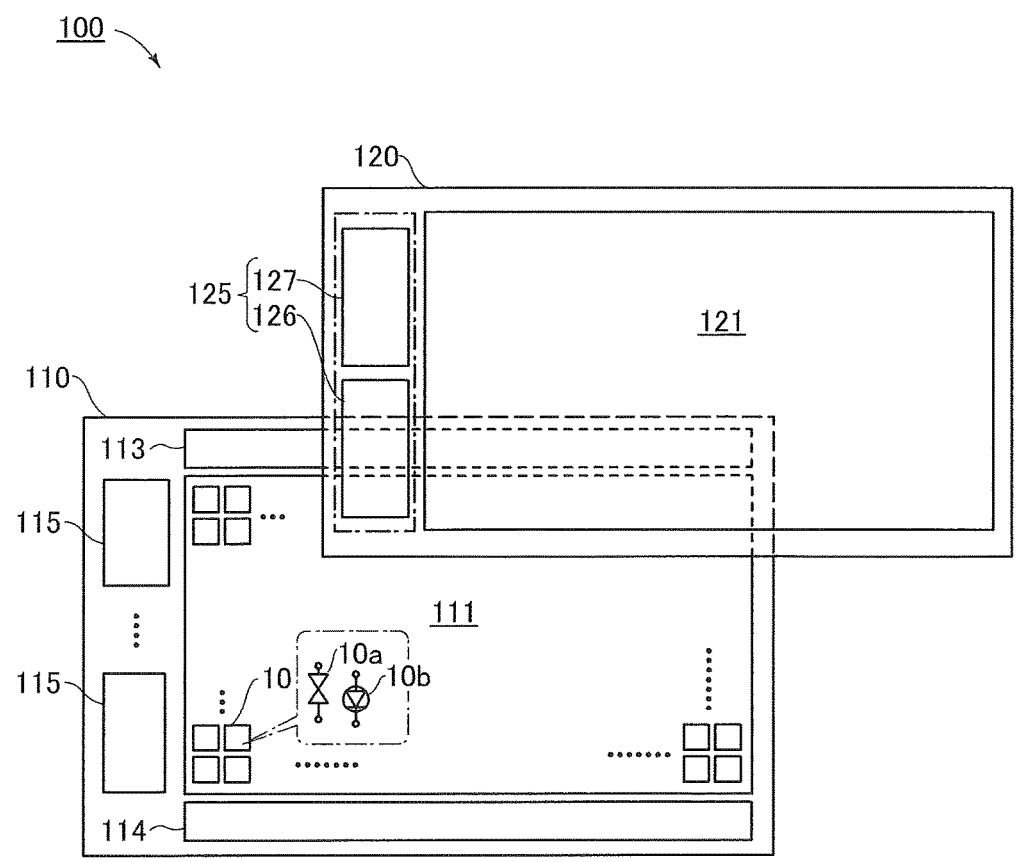
FIG. 1 is a block diagram illustrating a structure example of a display device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Any of the embodiments described below can be combined as appropriate.

Note that a controller IC described in embodiments is a semiconductor device including a transistor including silicon in a channel formation region, a transistor including an oxide semiconductor in a channel formation region, a capacitor, and the like. Thus, a controller IC can be referred to as a semiconductor device.

In this specification and the like, an oxide semiconductor is referred to as an OS in some cases. Thus, a transistor including an oxide semiconductor in a channel formation region is referred to as an oxide semiconductor transistor, an OS transistor, or an OSFET in some cases.

In the drawings and the like, the size, the layer thickness, the region, or the like is exaggerated for clarity in some cases. Therefore, embodiments of the present invention are not limited to such a scale. Note that the drawings are schematic views showing ideal examples, and embodiments of the present invention are not limited to shapes or values shown in the drawings.

The same elements or elements having similar functions, elements formed using the same material, elements formed at the same time, or the like in the drawings and the like are denoted by the same reference numerals, and the description thereof is not repeated in some cases.

In this specification and the like, the terms "film" and "layer" can be interchanged with each other. For example, the term "conductive layer" can be changed into the term "conductive film" in some cases. Moreover, the term "insulating film" can be changed into the term "insulating layer" in some cases.

In this specification and the like, the term for describing arrangement, such as "over" or "below" does not necessarily mean that a component is placed "directly over" or "directly below" another component. For example, the expression "a gate electrode over a gate insulating layer" can mean the case where there is an additional component between the gate insulating layer and the gate electrode.

In this specification and the like, the term "parallel" indicates that an angle formed between two straight lines is greater than or equal to −10° and less than or equal to 10°, and accordingly also includes the case where an angle is greater than or equal to −5° and less than or equal to 5°. The term "perpendicular" indicates that an angle formed between two straight lines is greater than or equal to 80° and less than or equal to 100°, and accordingly also includes the case where an angle is greater than or equal to 85° and less than or equal to 95°.

In this specification and the like, ordinal numbers such as "first", "second", and "third" are used in order to avoid confusion among components, and do not limit the number of components.

In this specification and the like, the term "electrically connected" includes the case where components are connected through an object having any electric function. There is no particular limitation on the "object having any electric function" as long as electric signals can be transmitted and received between components that are connected through the object. Examples of the "object having any electric function" include a switching element such as a transistor, a resistor, an inductor, a capacitor, and an element with a variety of functions as well as an electrode and a wiring.

In this specification and the like, "voltage" refers to a difference between a given potential and a reference potential (e.g., a ground potential) in many cases. Accordingly, voltage, potential, and potential difference can also be referred to as potential, voltage, and voltage difference, respectively.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, the functions of a source and a drain might be switched when transistors having different polarities are employed or a direction of current flow is changed in circuit operation, for example. Therefore, the terms "source" and "drain" can be interchanged in this specification and the like.

Unless otherwise specified, off-state current in this specification and the like refers to drain current of a transistor in an off state (also referred to as a non-conduction state or a cutoff state). Unless otherwise specified, the off state of an n-channel transistor means that a potential difference between its gate and source (Vgs: gate-source voltage) is lower than the threshold voltage Vth, and the off state of a p-channel transistor means that the gate-source voltage Vgs is higher than the threshold voltage Vth. That is, the off-state current of an n-channel transistor sometimes refers to drain current that flows when the gate-source voltage Vgs is lower than the threshold voltage Vth.

In the above description of off-state current, a drain may be replaced with a source. That is, the off-state current sometimes refers to current that flows through a source when a transistor is off.

In this specification and the like, the term "leakage current" sometimes expresses the same meaning as off-state current. In addition, in this specification and the like, the off-state current sometimes refers to current that flows between a source and a drain when a transistor is off, for example.

Embodiment 1

In this embodiment, a hybrid display device in which a reflection type element and a light emission type element are provided in one pixel will be described. In particular, a controller IC of the display device will be described. Note that liquid crystal, electronic paper, or the like can be used as the reflection type element. The reflection type element and the light emission type element will be described below as a reflective element 10a and a light-emitting element 10b, respectively.

<<Display Device>>

FIG. 1 is a block diagram illustrating a structure example of a display device. A display device 100 includes a display unit 110 and a touch sensor unit 120.

<Display Unit>

The display unit 110 includes a pixel array 111, a gate driver 113, a gate driver 114, and controller ICs 115.

The pixel array 111 includes a plurality of pixels 10, and each pixel 10 is an active element driven by a transistor. The pixel 10 includes the reflective element 10a and the light-emitting element 10b. A more specific structure example of the pixel array 111 will be described in Embodiment 2.

The gate driver 113 has a function of driving a gate line for selecting the reflective element 10a, and the gate driver 114 has a function of driving a gate line for selecting the light-emitting element 10b. The controller IC 115 is provided with a source driver for driving a source line that supplies a data signal to the reflective element 10a and a source driver for driving a source line that supplies a data signal to the light-emitting element 10b. The controller IC 115 has a function of collectively controlling the operation of the display device 100. The number of controller ICs 115 is determined in accordance with the number of pixels of the pixel array.

Although FIG. 1 illustrates an example in which the gate driver 113 and the gate driver 114 are integrated together with the pixel array 111 over the same substrate, the gate driver 113 and the gate driver 114 can be dedicated ICs. Alternatively, the gate driver 113 or the gate driver 114 may be incorporated in the controller ICs 115.

Although the controller IC 115 is mounted by a chip on glass (COG) method here, there is no particular limitation on the mounting method, and a chip on flexible (COF) method, a tape automated bonding (TAB) method, or the like may be employed. The same applies to a method for mounting an IC on the touch sensor unit 120.

Note that the transistor used for the pixel 10 is a transistor including an oxide semiconductor in a channel formation region (also referred to as an "OS transistor"), which has a lower off-state current than a Si transistor. The off-state current of an OS transistor can be extremely low by reducing the concentration of impurities in an oxide semiconductor to make the oxide semiconductor intrinsic or substantially intrinsic.

Alternatively, a transistor that does not include an oxide semiconductor can be used for the pixel 10 as long as an off-state current is low. For example, a transistor including a wide-bandgap semiconductor may be used. The wide-bandgap semiconductor is a semiconductor whose bandgap is 2.2 eV or greater. Examples of the wide-bandgap semiconductor include silicon carbide, gallium nitride, and diamond.

By using the transistor having a low off-state current for the pixel 10, the gate driver 113, the gate driver 114, and the source driver can be temporarily stopped (hereinafter the temporary stop is referred to as "idling stop" or "IDS driving") in the case where rewriting of a display screen is not necessary, that is, a still image is displayed. Power consumption of the display device 100 can be reduced by IDS driving.

<Touch Sensor Unit>

The touch sensor unit 120 in FIG. 1 includes a sensor array 121 and a peripheral circuit 125. The peripheral circuit 125 includes a touch sensor driver (hereinafter referred to as a "TS driver") 126 and a sensing circuit 127. The peripheral circuit 125 can be composed of a dedicated IC.

Figure 2:
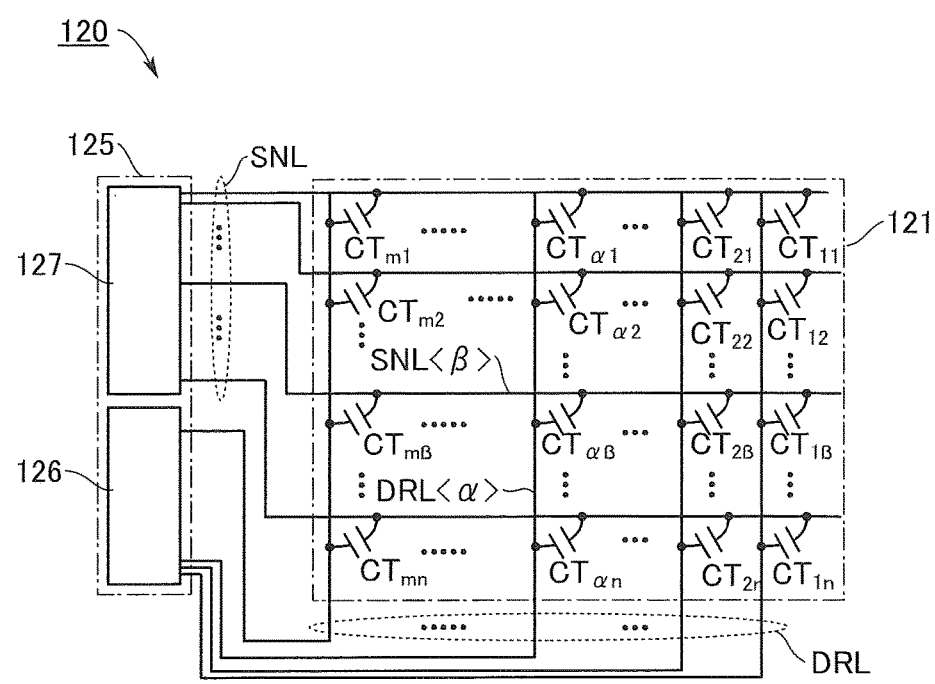
FIG. 2 illustrates a structure example of a touch sensor unit.

FIG. 2 illustrates a structure example of the touch sensor unit 120. Here, the touch sensor unit 120 is a mutual capacitive touch sensor unit as an example. The sensor array 121 includes m wirings DRL and n wirings SNL, where m is an integer greater than or equal to 1 and n is an integer greater than or equal to 1. The wiring DRL is a driving line, and the wiring SNL is a sensing line. Here, the α-th wiring DRL is referred to as wiring DRL<α>, and the β-th wiring SNL is referred to as wiring SNL<β>. A capacitor $CT_{\alpha\beta}$ refers to a capacitor formed between the wiring DRL<α> and the wiring SNL<β>.

The m wirings DRL are electrically connected to the TS driver 126. The TS driver 126 has a function of driving each wiring DRL. The n wirings SNL are electrically connected to the sensing circuit 127. The sensing circuit 127 has a function of sensing signals of wirings SNL. A signal of the wiring SNL<β> at the time when the wiring DRL<α> is driven by the TS driver 126 has information on the change amount of capacitance of the capacitor $CT_{\alpha\beta}$. By analysis of signals of n wirings SNL, information on whether touch operation is performed or not, touch position, and the like can be obtained.

<<Controller IC>>

Figure 3:
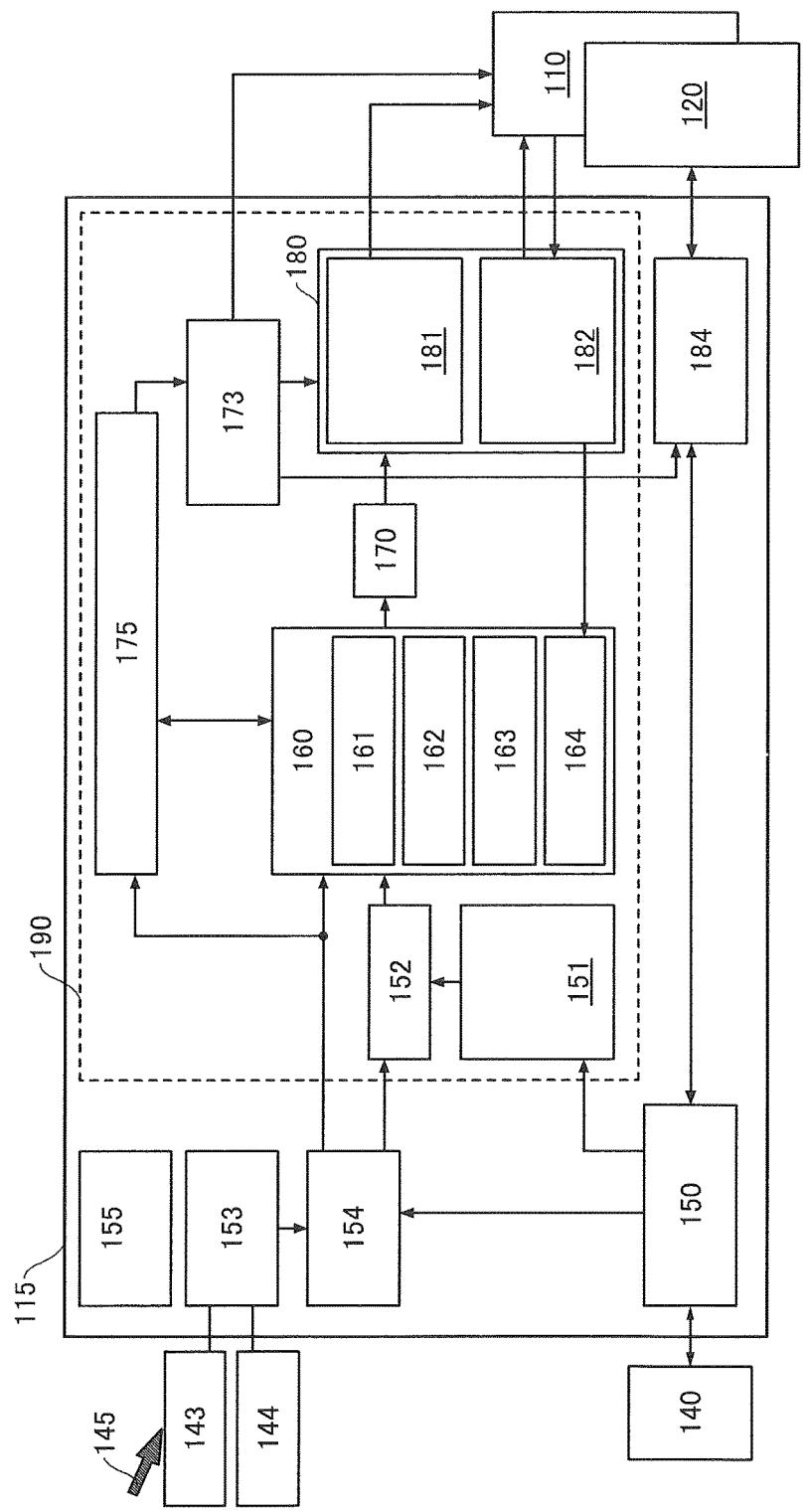
FIG. 3 is a block diagram illustrating a configuration example of a controller IC.

FIG. 3 is a block diagram illustrating a configuration example of the controller IC 115. The controller IC 115 includes an interface 150, a frame memory 151, a decoder 152, a sensor controller 153, a controller 154, a clock generation circuit 155, an image processing portion 160, a memory 170, a timing controller 173, a register 175, a source driver 180, and a touch sensor controller 184.

The source driver 180 includes a source driver 181 and a source driver 182. The source driver 181 is a driver for driving the reflective element 10a, and the source driver 182 is a driver for driving the light-emitting element 10b. Here, a controller IC in the case where the reflective element 10a is a liquid crystal (LC) element and the light-emitting element 10b is an electroluminescent (organic EL) element will be described.

Communication between the controller IC 115 and a host 140 is performed through the interface 150. Image data, a variety of control signals, and the like are transmitted from the host 140 to the controller IC 115. Information on a touch position or the like obtained by the touch sensor controller 184 is transmitted from the controller IC 115 to the host 140. Note that the decision whether the circuits included in the controller IC 115 are chosen or not is made as appropriate depending on the standard of the host 140, the specifications of the display device 100, and the like.

The frame memory 151 is a memory for storing the image data input to the controller IC 115. In the case where compressed image data is transmitted from the host 140, the frame memory 151 can store the compressed image data. The decoder 152 is a circuit for decompressing the compressed image data. When decompression of the image data is not needed, processing is not performed in the decoder 152. Alternatively, the decoder 152 can be provided between the frame memory 151 and the interface 150.

The image processing portion 160 has a function of performing various kinds of image processing on the image data. For example, the image processing portion 160 includes a gamma correction circuit 161, a dimming circuit 162, a toning circuit 163, and an EL correction circuit 164.

The EL correction circuit 164 is provided in the case where the source driver 182 is provided with a current detection circuit that detects current flowing through the light-emitting element 10b. The EL correction circuit 164 has a function of adjusting luminance of the light-emitting element 10b on the basis of a signal transmitted from the current detection circuit of the source driver 182.

The image data processed in the image processing portion 160 is output to the source driver 180 through the memory 170. The memory 170 is a memory for temporarily storing the image data. The source driver 181 and the source driver 182 each have a function of processing the input image data and writing the image data to the source line of the pixel array 111.

The timing controller 173 has a function of generating timing signals to be used in the source driver 180, the touch sensor controller 184, and the gate drivers 113 and 114 of the display unit 110.

The touch sensor controller 184 has a function of controlling the TS driver 126 and the sensing circuit 127 of the touch sensor unit 120. A signal including touch information read from the sensing circuit 127 is processed in the touch sensor controller 184 and transmitted to the host 140 through the interface 150. The host 140 generates image data reflecting the touch information and transmits the image data to the controller IC 115. Note that the controller IC 115 can reflect the touch information in the image data.

The clock generation circuit 155 has a function of generating a clock signal to be used in the controller IC 115. The controller 154 has a function of processing a variety of control signals transmitted from the host 140 through the interface 150 and controlling a variety of circuits in the controller IC 115. The controller 154 also has a function of controlling power supply to the variety of circuits in the controller IC 115. Hereinafter, temporary stop of power supply to a circuit that is not used is referred to as power gating.

The register 175 stores data used for the operation of the controller IC 115. The data stored in the register 175 includes a parameter used to perform correction processing in the image processing portion 160, parameters used to generate waveforms of a variety of timing signals in the timing controller 173, and the like. The register 175 is provided with a scan chain register including a plurality of registers.

The sensor controller 153 is electrically connected to an optical sensor 143. The optical sensor 143 senses external light 145 and generates a sensor signal. The sensor controller 153 generates a control signal on the basis of the sensor signal. The control signal generated in the sensor controller 153 is output to the controller 154, for example.

In the case where the reflective element 10a and the light-emitting element 10b display the same image data, the image processing portion 160 has a function of separately generating image data that the reflective element 10a displays and image data that the light-emitting element 10b displays. In that case, reflection intensity of the reflective element 10a and emission intensity of the light-emitting element 10b can be adjusted in response to brightness of the external light 145 measured using the optical sensor 143 and the sensor controller 153. Here, the adjustment can be referred to as dimming or dimming treatment. In addition, a circuit that performs the dimming treatment is referred to as a dimming circuit.

In the case where the display device 100 is used outside at daytime on a sunny day, it is not necessary to make the light-emitting element 10b emit light if sufficient luminance can be obtained only with the reflective element 10a. This is due to the fact that favorable display cannot be obtained because, even when the light-emitting element 10b is used to perform display, external light exceeds light emitted from the light-emitting element 10b. In contrast, in the case where the display device 100 is used at night or in a dark place, display is performed by making the light-emitting element 10b emit light.

In response to the brightness of external light, the image processing portion 160 can generate image data that only the reflective element 10a displays, image data that only the light-emitting element 10b displays, or image data that the reflective element 10a and the light-emitting element 10b display in combination. The display device 100 can perform favorable display even in an environment with bright external light or an environment with weak external light. Furthermore, power consumption can be reduced by making the light-emitting element 10b emit no light or reducing the luminance of the light-emitting element 10b in the environment with bright external light.

Color tones can be corrected by combining the display by the light-emitting element 10b with the display by the reflective element 10a. A function of measuring the color tones of the external light 145 may be added to the optical sensor 143 and the sensor controller 153 to perform such tone correction. For example, in the case where the display device 100 is used in a reddish environment at evening, a blue (B) component is not sufficient only with the display by the reflective element 10a; thus, the color tones can be corrected by making the light-emitting element 10b emit light. Here, the correction can be referred to as toning or toning treatment. In addition, a circuit that performs the toning treatment is referred to as a toning circuit.

The image processing portion 160 might include another processing circuit such as an RGB-RGBW conversion circuit depending on the specifications of the display device 100. The RGB-RGBW conversion circuit has a function of converting image data of red, green, and blue (RGB) into image data of red, green, blue, and white (RGBW). That is, in the case where the display device 100 includes pixels of four colors of RGBW, power consumption can be reduced by displaying a white (W) component in the image data using the white (W) pixel. Note that the image processing portion 160 may include, for example, a RGB-RGBY (red, green, blue, and yellow) conversion circuit without limitation to the RGB-RGBW conversion circuit.

The reflective element 10a and the light-emitting element 10b can display different image data. In general, operation speed of liquid crystal, electronic paper, or the like that can be used as a reflective element is low in many cases (it takes time to display a picture). Thus, a still image to be a background can be displayed on the reflective element 10a and a moving mouse pointer or the like can be displayed on the light-emitting element 10b. By performing the above IDS driving on a still image and making the light-emitting element 10b emit light to display a moving image, the display device 100 can achieve display of a smooth moving image and reduction of power consumption at the same time. In that case, the frame memory 151 may be provided with regions for storing image data displayed on the reflective element 10a and image data displayed on the light-emitting element 10b.

<Parameter>

Image correction processing such as gamma correction, dimming, or toning corresponds to processing of generating output correction data Y with respect to input image data X. The parameter that the image processing portion 160 uses is a parameter for converting the image data X into the correction data Y.

Figure 4A:
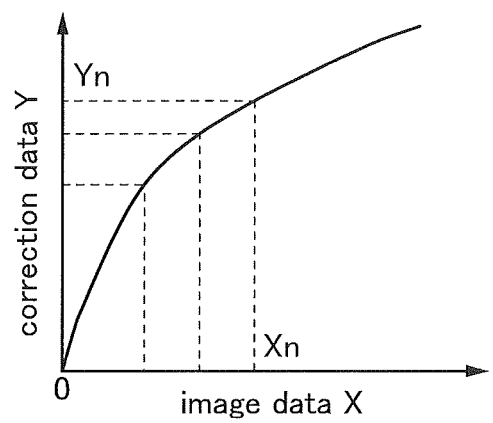
FIGS. 4A to 4C each explain a parameter.
Figure 4B:
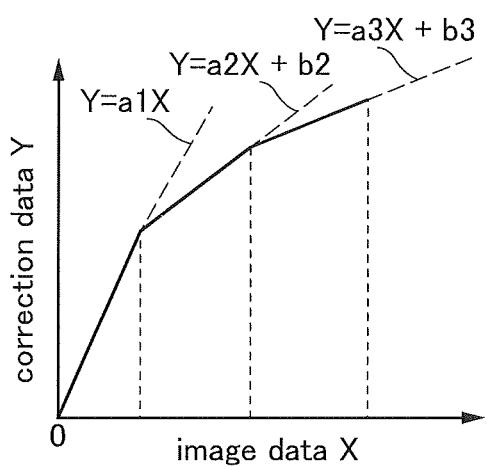

As a parameter setting method, there are a table method and a function approximation method. In a table method explained in FIG. 4A, correction data Yn with respect to image data Xn is stored in a table as a parameter. In the table method, a number of registers for storing the parameters that correspond to the table is necessary; however, correction can be performed with high degree of freedom. In contrast, in the case where the correction data Y with respect to the image data X can be empirically determined in advance, it is effective to employ a function approximation method as explained in FIG. 4B. Note that a1, a2, b2, and the like are parameters. Although a method of performing linear approximation in every period is shown here, a method of performing approximation with a nonlinear function can be employed. In the function approximation method, correction is performed with low degree of freedom; however, the number of registers for storing parameters that defines a function can be small.

Figure 4C:
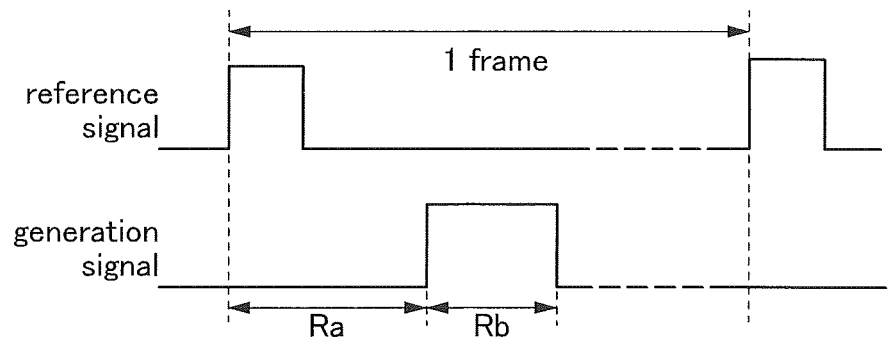

The parameter that the timing controller 173 uses indicates timing at which a generation signal of the timing controller 173 becomes "L" (or "H") with respect to a reference signal as explained in FIG. 4C. A parameter Ra (or Rb) indicates the number of clock cycles that corresponds to timing at which the parameter becomes "L" (or "H") with respect to the reference signal.

The above parameter for correction can be stored in the register 175. Other parameters that can be stored in the register 175 include data of the EL correction circuit 164, luminance, color tones, and setting of energy saving (time until display is made dark or turn off display) of the display device 100 which are set by a user, sensitivity of the touch sensor controller 184, and the like.

<Power Gating>

In the case where image data transmitted from the host 140 is not changed, the controller 154 can power gate some circuits in the controller IC 115. Specifically, for example, the circuits are circuits in a region 190 (the frame memory 151, the decoder 152, the image processing portion 160, the memory 170, the timing controller 173, the register 175, and the source driver 180). Power gating can be performed in the case where a control signal that indicates no change in the image data is transmitted from the host 140 to the controller IC 115 and detected by the controller 154.

The circuits in the region 190 are the circuits relating to image data and the circuits for driving the display unit 110; therefore, the circuits in the region 190 can be temporarily stopped in the case where the image data is not changed. Note that even when the image data is not changed, time during which the transistor used for the pixel 10 can store data (time during which idling stop can be performed) and time during which inversion driving is performed to prevent burn-in of a liquid crystal (LC) element used as the reflective element 10a may be considered.

For example, the controller 154 may be incorporated with a timer function so as to determine timing at which power supply to the circuits in the region 190 is restarted, on the basis of time measured by a timer. Note that it is possible to store image data in the frame memory 151 or the memory 170 in advance and supply the image data to the display unit 110 at inversion driving. With such a structure, inversion driving can be performed without transmitting the image data from the host 140. Thus, the amount of data transmitted from the host 140 can be reduced and power consumption of the controller IC 115 can be reduced.

Specific circuit configurations of the frame memory 151 and the register 175 will be described below. Note that the circuits that can be power gated are not limited to the circuits in the region 190, the sensor controller 153, the touch sensor controller 184, and the like, which are described here. A variety of combinations can be considered depending on the configuration of the controller IC 115, the standard of the host 140, the specifications of the display device 100, and the like.

<Frame Memory 151>

FIG. 5A illustrates a configuration example of the frame memory 151. The frame memory 151 includes a control portion 202, a cell array 203, and a peripheral circuit 208. The periphery circuit 208 includes a sense amplifier circuit 204, a driver 205, a main amplifier 206, and an input/output circuit 207.

The control portion 202 has a function of controlling the frame memory 151. For example, the control portion 202 controls the driver 205, the main amplifier 206, and the input/output circuit 207.

The driver 205 is electrically connected to a plurality of wirings WL and CSEL. The driver 205 generates signals output to the plurality of wirings WL and CSEL.

The cell array 203 includes a plurality of memory cells 209. The memory cells 209 are electrically connected to wirings WL, LBL (or LBLB), and BGL. The wiring WL is a word line. The wirings LBL and LBLB are local bit lines. Although a folded-bit-line method is employed for the configuration of the cell array 203 in the example of FIG. 5A, an open-bit-line method can also be employed.

FIG. 5B illustrates a configuration example of the memory cell 209. The memory cell 209 includes a transistor MW1 and a capacitor CS1. The memory cell 209 has a circuit configuration similar to that of a memory cell for a dynamic random access memory (DRAM). The transistor MW1 in this example is a transistor having a back gate. The back gate of the transistor MW1 is electrically connected to a wiring BGL. A voltage Vbg_w1 is input to the wiring BGL.

The transistor MW1 is a transistor including an oxide semiconductor in a channel formation region (such a transistor is also referred to as an "OS transistor"). Since an OS transistor has an extremely low off-state current, the frequency of refresh operation of the frame memory 151 can be reduced because leakage of charge from the capacitor CS1 can be suppressed by forming the memory cell 209 using an OS transistor. The frame memory 151 can retain image data for a long time even when power supply is stopped. Moreover, by setting the voltage Vbg_w1 to a negative voltage, the threshold voltage of the transistor MW1 can be shifted to the positive potential side and thus the retention time of the memory cell 209 can be increased.

Here, an off-state current refers to a current that flows between a source and a drain of a transistor in an off state. In the case of an n-channel transistor, for example, when the threshold voltage of the transistor is approximately 0 V to 2 V, a current flowing between a source and a drain when a voltage of a gate with respect to the source is negative can be referred to as an off-state current. An extremely low off-state current means that, for example, an off-state current per micrometer of channel width is lower than or equal to 100 zA (z represents zepto and denotes a factor of $10^{-21}$). Since the off-state current is preferably as low as possible, the normalized off-state current is lower than or equal to 10 zA/μm, preferably lower than or equal to 1 zA/μm and further preferably lower than or equal to 10 yA/μm (y represents yocto and denotes a factor of $10^{-24}$).

An oxide semiconductor has a bandgap of 3.0 eV or higher; thus, an OS transistor has low leakage current due to thermal excitation and, as described above, extremely low off-state current. An oxide semiconductor used in a channel formation region is preferably formed from an oxide semiconductor containing at least one of indium (In) and zinc (Zn). Typical examples of such an oxide semiconductor include an In-M-Zn oxide (M is Al, Ga, Y, or Sn, for example). By reducing impurities serving as electron donors, such as moisture or hydrogen, and also reducing oxygen vacancies, an i-type (intrinsic) or substantially i-type oxide semiconductor can be obtained. Here, such an oxide semiconductor can be referred to as a highly purified oxide semiconductor. By using a highly purified oxide semiconductor, the off-state current of the OS transistor that is normalized by channel width can be as low as approximately several yoctoamperes per micrometer to several zeptoamperes per micrometer.

The transistors MW1 in the plurality of memory cells 209 included in the cell array 203 are OS transistors; thus, Si transistors formed over a silicon wafer can be used as transistors in other circuits, for example. Accordingly, the cell array 203 can be stacked over the sense amplifier circuit 204. Thus, the circuit area of the frame memory 151 can be reduced, which leads to miniaturization of the controller IC 115.

The cell array 203 is stacked over the sense amplifier circuit 204. The sense amplifier circuit 204 includes a plurality of sense amplifiers SA. The sense amplifiers SA are electrically connected to adjacent wirings LBL and LBLB (a pair of local bit lines), wirings GBL and GBLB (a pair of global bit lines), and the plurality of wirings CSEL. The sense amplifiers SA have a function of amplifying the potential difference between the wirings LBL and LBLB.

In the sense amplifier circuit 204, one wiring GBL is provided for four wirings LBL, and one wiring GBLB is provided for four wirings LBLB. However, the configuration of the sense amplifier circuit 204 is not limited to the configuration example of FIG. 5A.

The main amplifier 206 is connected to the sense amplifier circuit 204 and the input/output circuit 207. The main amplifier 206 has a function of amplifying the potential difference between the wirings GBL and GBLB. The main amplifier 206 is not necessarily provided.

The input/output circuit 207 has a function of outputting a potential corresponding to a write data to the wirings GBL and GBLB or the main amplifier 206 and a function of outputting the potentials of the wirings GBL and GBLB or an output potential of the main amplifier 206 to the outside as read data. The sense amplifier SA from which data is read and the sense amplifier SA to which data is written can be selected using the signal of the wiring CSEL. Therefore, there is no need to provide a selection circuit such as a multiplexer in the input/output circuit 207. Thus, the input/output circuit 207 can have a simple circuit configuration and a small occupied area.

<Register 175>

Figure 6:
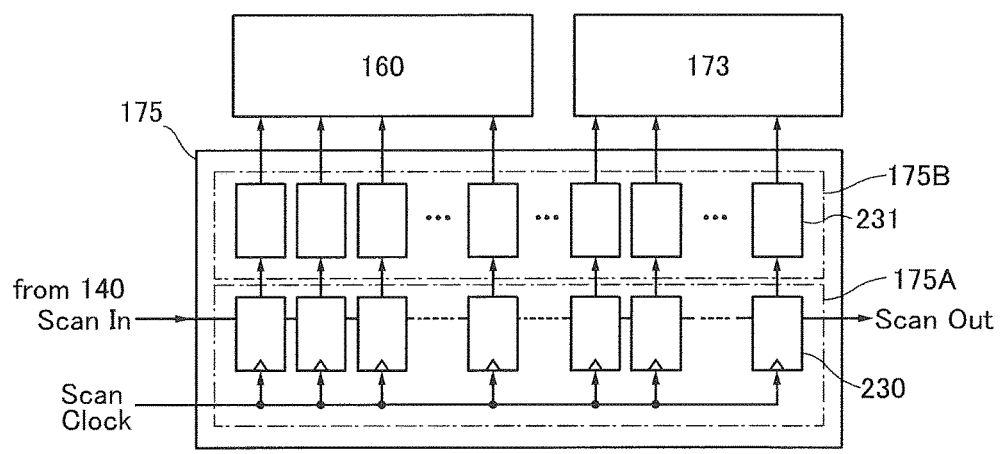
FIG. 6 is a block diagram illustrating a configuration example of a register.

FIG. 6 is a block diagram illustrating a configuration example of the register 175. The register 175 includes a scan chain register portion 175A and a register portion 175B. The scan chain register portion 175A includes a plurality of registers 230. The scan chain register is formed by the plurality of registers 230. The register portion 175B includes a plurality of registers 231.

The register 230 is a nonvolatile register which does not lose data even when power supply is stopped. Here, the register 230 is provided with a retention circuit including an OS transistor to be nonvolatile.

The other register 231 is a volatile register. There is no particular limitation on the circuit configuration of the register 231, and a latch circuit, a flip-flop circuit, or the like is used as long as data can be stored. The image processing portion 160 and the timing controller 173 access the register portion 175B and take data from the corresponding registers 231. Alternatively, the processing contents of the image processing portion 160 and the timing controller 173 are controlled in accordance with data supplied from the register portion 175B.

To update data stored in the register 175, first, data in the scan chain register portion 175A are changed. After the data in the registers 230 of the scan chain register portion 175A are rewritten, the data are loaded into the registers 231 of the register portion 175B at the same time.

Accordingly, the image processing portion 160, the timing controller 173, and the like can perform various kinds of processing using the data which are updated at the same time. The operation of the controller IC 115 can be stable because simultaneity can be maintained in updating data. By providing the scan chain register portion 175A and the register portion 175B, data in the scan chain register portion 175A can be updated even during the operation of the image processing portion 160 and the timing controller 173.

At the time when the controller IC 115 is power gated, power supply is stopped after data is stored (saved) in the retention circuit of the register 230. After the power supply is restored, nominal operation is restarted after data in the registers 230 are restored (loaded) in the register 231. Note that in the case where the data stored in the register 230 and the data stored in the register 231 do not match each other, it is preferable to save the data of the register 231 in the register 230 and then store the data again in the retention circuit of the register 230. For example, while updated data is inserting in the scan chain register portion 175A, the data do not match each other.

Figure 7:
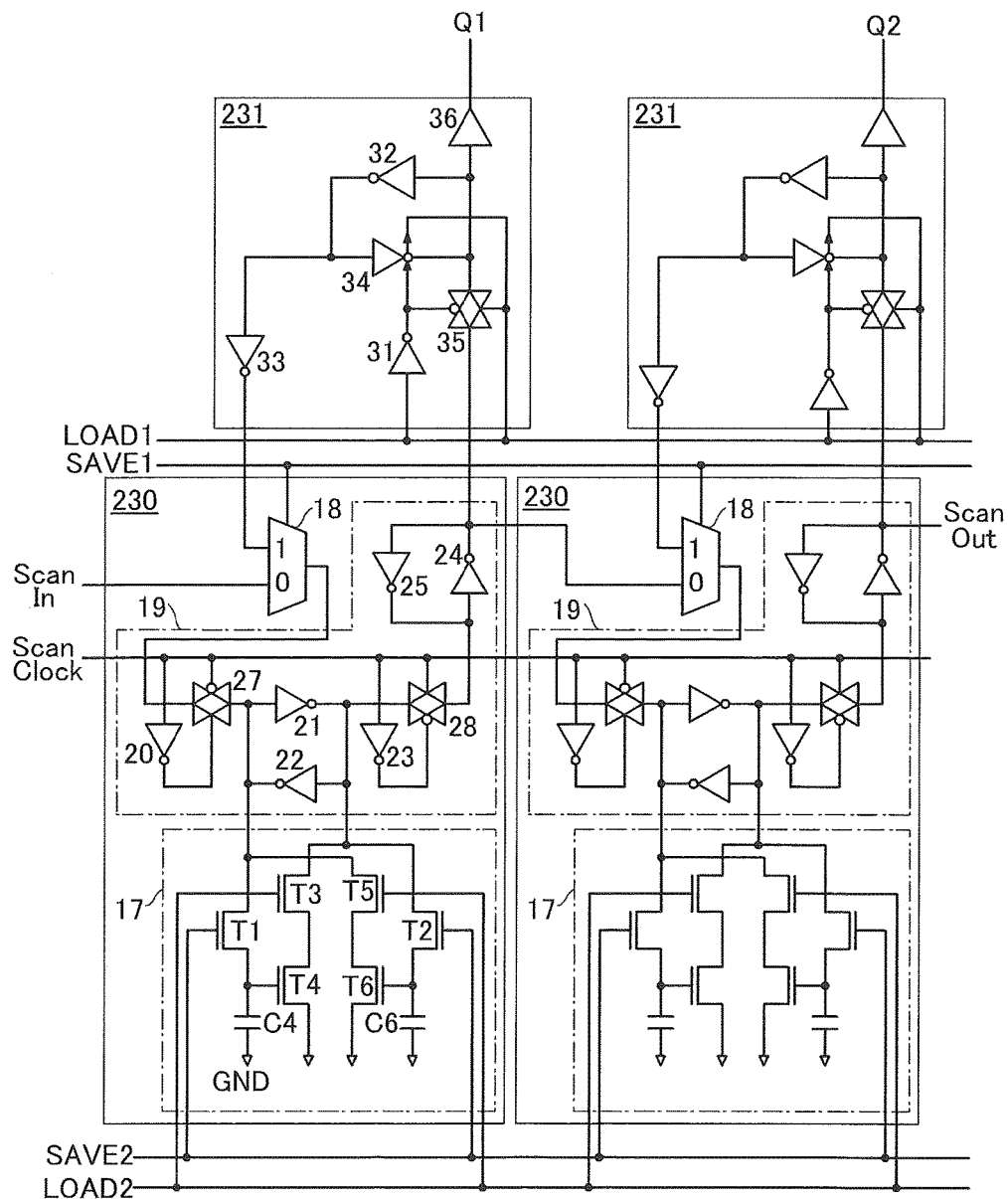
FIG. 7 is a circuit diagram illustrating a configuration example of a register.

FIG. 7 illustrates an example of a circuit configuration of the register 230 and the register 231. FIG. 7 illustrates two registers 230 of the scan chain register portion 175A and corresponding two registers 231. A signal Scan In is input to the register 230, and the register 230 outputs a signal Scan Out.

The register 230 includes a retention circuit 17, a selector 18, and a flip-flop circuit 19. The selector 18 and the flip-flop circuit 19 form a scan flip-flop circuit. A signal SAVE1 is input to the selector 18.

A signal SAVE2 and a signal LOAD2 are input to the retention circuit 17. The retention circuit 17 includes a transistor T1, a transistor T2, a transistor T3, a transistor T4, a transistor T5, a transistor T6, a capacitor C4, and a capacitor C6. The transistor T1 and the transistor T2 are OS transistors. The transistor T1 and the transistor T2 may each be an OS transistor having a back gate similar to the transistor MW1 of the memory cell 209 (see FIG. 5B).

A 3-transistor gain cell is formed by the transistor T1, the transistor T3, the transistor T4, and the capacitor C4. In a similar manner, a 3-transistor gain cell is formed by the transistor T2, the transistor T5, the transistor T6, and the capacitor C6. The two gain cells store complementary data retained in the flip-flop circuit 19. Since the transistor T1 and the transistor T2 are OS transistors, the retention circuit 17 can retain data for a long time even when power supply is stopped. In the register 230, the transistors other than the transistor T1 and the transistor T2 may be formed using Si transistors.

The retention circuit 17 stores complementary data retained in the flip-flop circuit 19 in response to the signal SAVE2 and loads the retained data in the flip-flop circuit 19 in response to the signal LOAD2.

An output terminal of the selector 18 is electrically connected to an input terminal of the flip-flop circuit 19, and an input terminal of the register 231 is electrically connected to a data output terminal. The flip-flop circuit 19 includes an inverter 20, an inverter 21, an inverter 22, an inverter 23, an inverter 24, an inverter 25, an analog switch 27, and an analog switch 28. The conduction state between the analog switch 27 and the analog switch 28 is controlled by a scan clock signal. The flip-flop circuit 19 is not limited to the circuit configuration in FIG. 7 and a variety of flip-flop circuits 19 can be employed.

An output terminal of the register 231 is electrically connected to one of two input terminals of the selector 18, and an output terminal of the flip-flop circuit 19 in the previous stage is electrically connected to the other input terminal of the selector 18. Note that data is input from the outside of the register 175 to the input terminal of the selector 18 in the first stage of the scan chain register portion 175A.

The register 231 includes an inverter 31, an inverter 32, an inverter 33, a clocked inverter 34, an analog switch 35, and a buffer 36. The register 231 loads the data of the flip-flop circuit 19 on the basis of a signal LOAD1. The transistors of the register 231 may be formed using Si transistors.

<Another Configuration Example of Controller IC>

Another configuration example of a controller IC will be described below.

Figure 8:
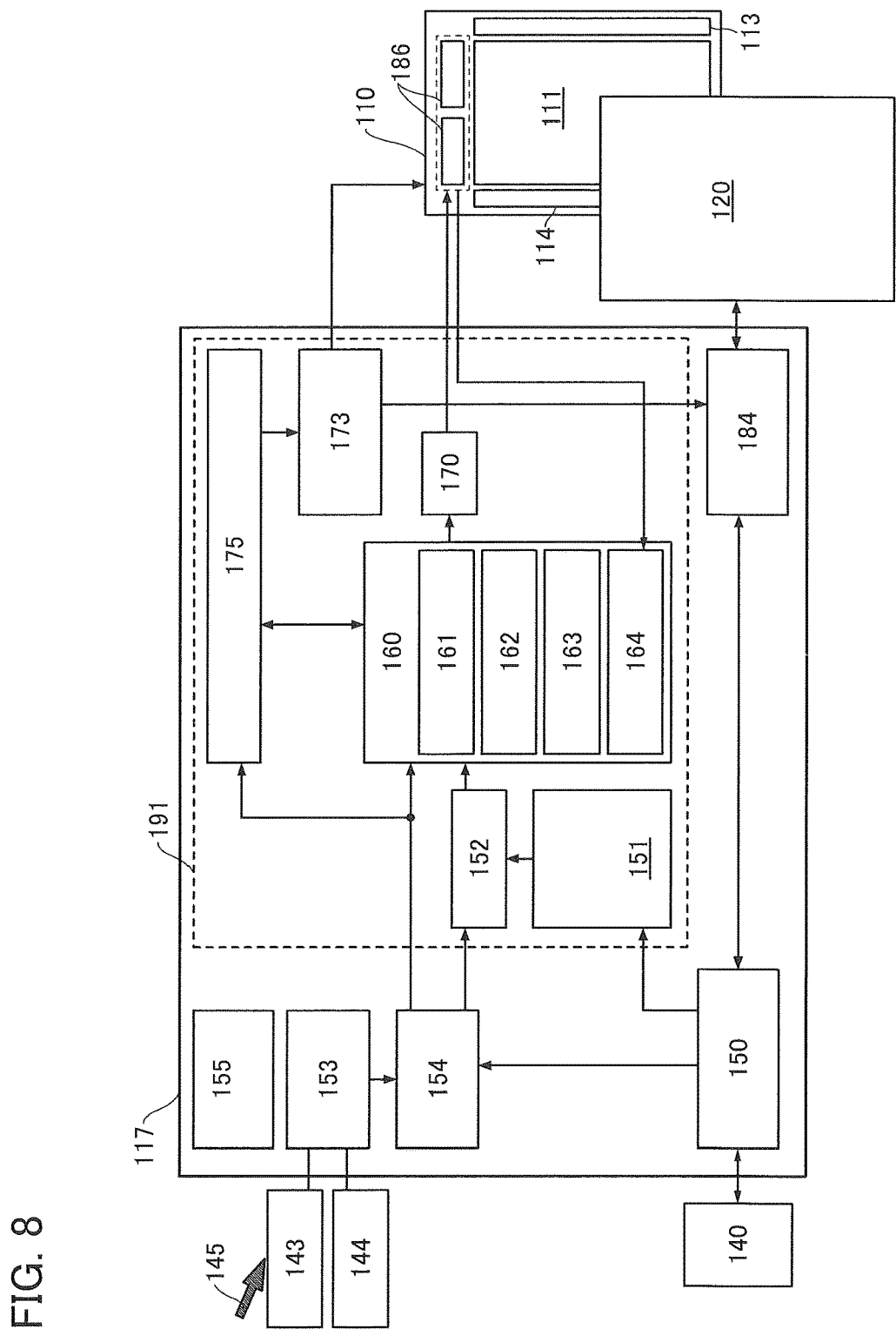
FIG. 8 is a block diagram illustrating a configuration example of a controller IC.

FIG. 8 illustrates a configuration example of a controller IC without a source driver. A controller IC 117 in FIG. 8 is a modification example of the controller IC 115 and includes a region 191. The controller 154 controls power supply to circuits in the region 191.

The region 191 is not provided with a source driver. Thus, the display unit 110 includes a source driver IC 186. The number of source driver ICs 186 is determined in accordance with the number of pixels of the pixel array 111.

The source driver IC 186 has a function of driving both the reflective element 10*a* and the light-emitting element 10*b*. Although the source driver is formed using only one kind of source driver IC 186, the configuration of the source driver is not limited thereto. For example, the source driver may be formed using a source driver IC for driving the reflective element 10*a* and a source driver IC for driving the light-emitting element 10*b*.

Similar to the gate driver 113 and the gate driver 114, the source drivers may be formed over a substrate of the pixel array 111.

The controller IC 117 may be provided with one or both of the TS driver 126 and the sensing circuit 127. The same applies to the controller IC 115.

<<Operation Example>>

Operation examples of the controller IC 115 and the register 175 of the display device 100 before shipment, at boot-up of an electronic device including the display device 100, and at normal operation will be described separately.

<Before Shipment>

Parameters relating to the specifications and the like of the display device 100 are stored in the register 175 before shipment. These parameters include, for example, the number of pixels, the number of touch sensors, parameters used to generate waveforms of the variety of timing signals in the timing controller 173, and correction data of the EL correction circuit 164 in the case where the source driver 182 is provided with the current detection circuit that detects current flowing through the light-emitting element 10*b*. These parameters may be stored by providing a dedicated ROM other than the register 175.

<At Boot-Up>

At boot-up of an electronic device including the display device 100, the parameters set by a user or the like which are transmitted from the host 140 are stored in the register 175. These parameters include, for example, luminance, color tones, sensitivity of a touch sensor, setting of energy saving (time until display is made dark or turn off display), and a curve or a table for gamma correction. Note that in storing the parameters in the register 175, a scan clock signal and data corresponding to the parameters in synchronization with the scan clock signal are transmitted from the controller 154 to the register 175.

<Normal Operation>

Normal operation can be classified into a state of displaying a moving image or the like, a state capable of performing IDS driving while a still image is displaying, a state of displaying no image, and the like. The image processing portion 160, the timing controller 173, and the like are operating in the state of displaying a moving image or the like; however, the image processing portion 160 and the like are not influenced because the data of the register 175 in the scan chain register portion 175A are changed. After the data of the scan chain register portion 175A are changed, the data of the scan chain register portion 175A are loaded in the register portion 175B at the same time, so that change of the data of the register 175 is completed. The operation of the image processing portion 160 and the like is switched to the operation corresponding to the data.

In the state capable of performing IDS driving while a still image is displaying, the register 175 can be power gated in a manner similar to that of the other circuits in the region 190. In that case, the complementary data retained in the flip-flop circuit 19 is stored in the retention circuit 17 in response to the signal SAVE2 before the power gating in the register 230 included in the scan chain register portion 175A.

To restore the data retained in the retention circuit 17 from power gating, the data is loaded in the flip-flop circuit 19 in response to the signal LOAD2 and the data in the flip-flop circuit 19 is loaded in the register 231 in response to the signal LOAD1. In this manner, the data of the register 175 becomes effective in the same state as before the power gating. Note that even when the register 175 is in a state of power gating, the parameter of the register 175 can be changed by canceling the power gating in the case where change of the parameter is requested by the host 140.

In the state of displaying no image, for example, the circuits (including the register 175) in the region 190 can be power gated. In that case, the operation of the host 140 might also be stopped; however, when the data in the frame memory 151 and the register 175 are restored from the power gating, the frame memory 151 and the register 175 can perform display (a still image) before power gating without waiting the restore of the host 140 because they are nonvolatile.

For example, in the case where the display device 100 is employed for a display portion of a foldable cellular phone, when the cellular phone is folded and the display surface of the display device 100 is sensed to be unused by a signal from an open/close sensor 144, the sensor controller 153, the touch sensor controller 184, and the like can be power gated in addition to the circuits in the region 190.

When the cellular phone is folded, the operation of the host 140 might be stopped depending on the standard of the host 140. Even when the cellular phone is unfolded while the operation of the host 140 is stopped, the image data in the frame memory 151 can be displayed before image data, a variety of control signals, and the like are transmitted from the host 140 because the frame memory 151 and the register 175 are nonvolatile.

In such a manner, the register 175 includes the scan chain register portion 175A and the register portion 175B and data of the scan chain register portion 175A are changed, so that the data can be changed smoothly without influencing the image processing portion 160, the timing controller 173, and the like. Each register 230 in the scan chain register portion 175A includes the retention circuit 17 and can perform transfer to and restore from a power gated state smoothly.

Embodiment 2

In this embodiment, details of the display unit 110 described in Embodiment 1 will be described.

<Configuration Example of Display Panel>

Figure 9:
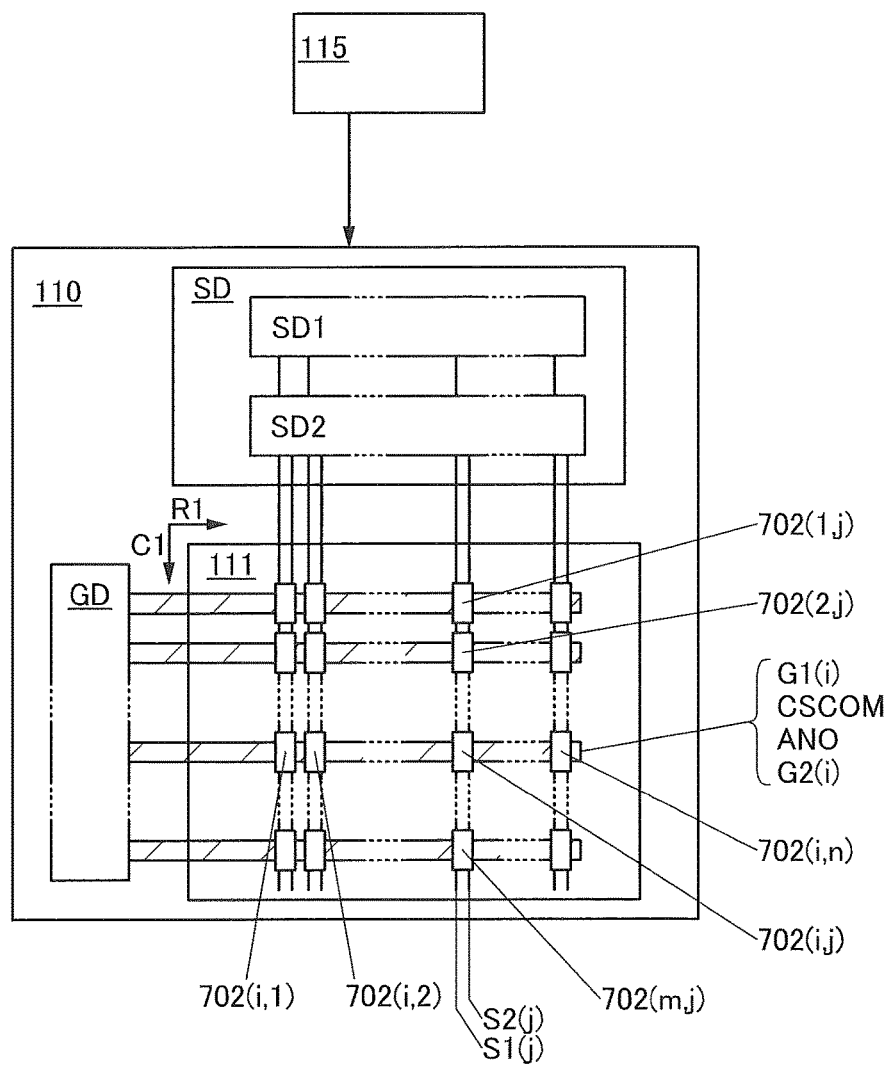
FIG. 9 is block diagram illustrating a structure example of a display unit.

FIG. 9 is a block diagram illustrating a configuration example of the display unit 110.

The display unit 110 includes the pixel array 111. The display unit 110 can include a gate driver GD or a source driver SD.

<<Pixel Array 111>>

The pixel array 111 includes one group of pixels $702(i,1)$ to $702(i,n)$, another group of pixels $702(1,j)$ to $702(m,j)$, and a scan line $G1(i)$. In addition, a scan line $G2(i)$, a wiring CSCOM, a wiring ANO, a signal line $S1(j)$, and a signal line $S2(j)$ are provided. Note that i is an integer greater than or equal to 1 and less than or equal to m, j is an integer greater than or equal to 1 and less than or equal to n, and each of m and n is an integer greater than or equal to 1.

The one group of pixels $702(i,1)$ to $702(i,n)$ include the pixel $702(i,j)$ and are provided in the row direction (the direction indicated by the arrow R1 in the drawing).

The another group of pixels $702(1,j)$ to $702(m,j)$ include the pixel $702(i,j)$ and are provided in the column direction (the direction indicated by the arrow C1 in the drawing) that intersects the row direction.

The scan line $G1(i)$ and the scan line $G2(i)$ are electrically connected to the one group of pixels $702(i,1)$ to $702(i,n)$ provided in the row direction.

The another group of pixels $702(1,j)$ to $702(m,j)$ provided in the column direction are electrically connected to the signal line $S1(j)$ and the signal line $S2(j)$.

<<Gate Driver GD>>

The gate driver GD has a function of supplying a selection signal on the basis of control data.

For example, the gate driver GD has a function of supplying a selection signal to one scan line at a frequency of 30 Hz or higher, preferably 60 Hz or higher, on the basis of the control data. Accordingly, moving images can be smoothly displayed.

For example, the gate driver GD has a function of supplying a selection signal to one scan line at a frequency lower than 30 Hz, preferably lower than 1 Hz, and further preferably less than once per minute, on the basis of the control data. Accordingly, a still image can be displayed while flickering is suppressed.

<<Source Driver SD, Source Driver SD1, and Source Driver SD2>>

The source driver SD includes a source driver SD1 and a source driver SD2. The source driver SD1 and the source driver SD2 have a function of supplying a data signal on the basis of a signal from the controller IC 115.

The source driver SD1 has a function of generating a data signal that is to be supplied to a pixel circuit electrically connected to one display element. Specifically, the source driver SD1 has a function of generating a signal whose polarity is inverted. With this configuration, for example, a liquid crystal display element can be driven.

The source driver SD2 has a function of generating a data signal that is supplied to a pixel circuit electrically connected to another display element (hereinafter also referred to as a second display element) which displays an image by a method different from that of the one display element. With this configuration, for example, an organic EL element can be driven.

For example, a variety of sequential circuits, such as a shift register, can be used for the source driver SD.

For example, an integrated circuit in which the source driver SD1 and the source driver SD2 are integrated can be used for the source driver SD. Specifically, an integrated circuit formed over a silicon substrate can be used for the source driver SD.

The source driver SD may be included in the same integrated circuit as the controller IC 115. Specifically, an integrated circuit formed over a silicon substrate can be used for each of the controller IC 115 and the source driver SD.

For example, the above integrated circuit can be mounted on a terminal by a chip on glass (COG) method or a chip on film (COF) method. Specifically, an anisotropic conductive film can be used to mount an integrated circuit on the terminal.

<<Pixel Circuit>>

Figure 10:
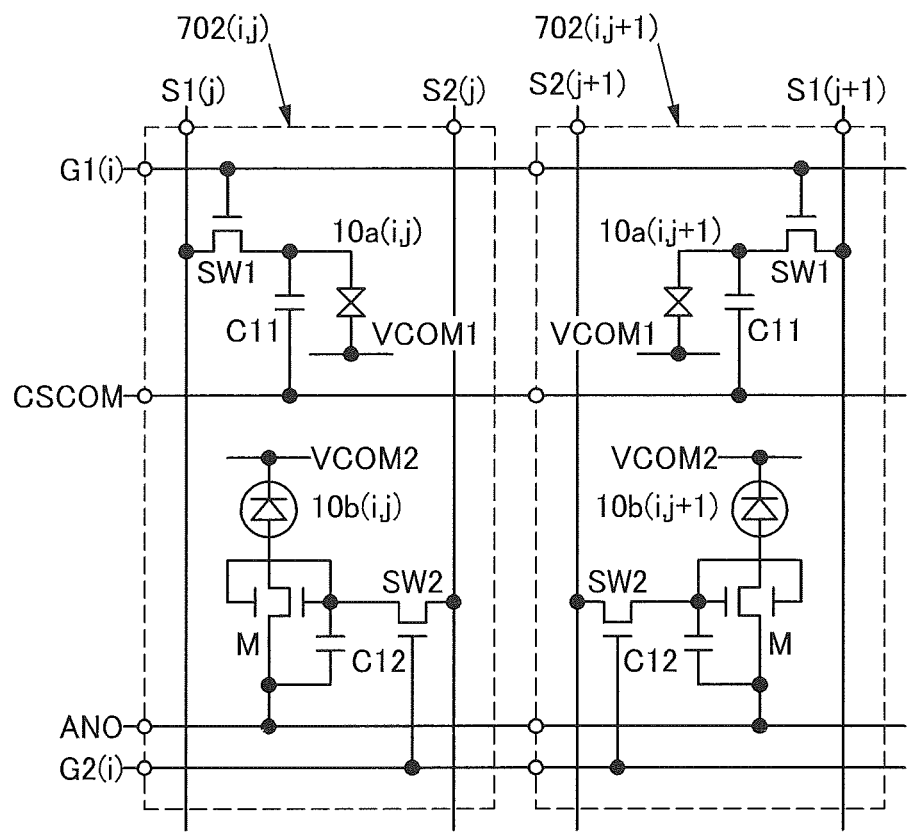
FIG. 10 is a circuit diagram illustrating a configuration example of a pixel.

FIG. 10 is a circuit diagram illustrating configuration examples of pixels 702. The pixel $702(i,j)$ has a function of driving a reflective element $10a(i,j)$ and a light-emitting element $10b(i,j)$. Accordingly, the reflective element 10a and the light-emitting element 10b which perform display using a different method from that of the reflective element 10a can be driven, for example, with the pixel circuit which can be formed in the same process. The display performed using the reflective element 10a, which is a reflective display element, can be performed with lower power consumption. Alternatively, an image with high contrast can be favorably displayed in an environment with bright external light. With the use of the light-emitting element 10b, which is a light-emitting display element, images can be favorably displayed in a dark environment.

The pixel $702(i,j)$ is electrically connected to the signal line $S1(j)$, the signal line $S2(j)$, the scan line $G1(i)$, the scan line $G2(i)$, the wiring CSCOM, and the wiring ANO.

The pixel $702(i,j)$ includes a switch SW1, a capacitor C11, a switch SW2, a transistor M, and a capacitor C12.

A transistor that includes a gate electrode electrically connected to the scan line $G1(i)$ and a first electrode electrically connected to the signal line $S1(j)$ can be used as the switch SW1.

The capacitor C11 includes a first electrode electrically connected to a second electrode of the transistor used as the switch SW1 and includes a second electrode electrically connected to the wiring CSCOM.

A transistor that includes a gate electrode electrically connected to the scan line $G2(i)$ and a first electrode electrically connected to the signal line $S2(j)$ can be used as the switch SW2.

The transistor M includes a gate electrode electrically connected to a second electrode of the transistor used as the switch SW2 and includes a first electrode electrically connected to the wiring ANO.

Note that the transistor M may include a first gate electrode and a second gate electrode. The first gate electrode and the second gate electrode may be electrically connected to each other. The first gate electrode and the second gate electrode preferably have regions overlapping with each other with a semiconductor film positioned therebetween.

The capacitor C12 includes a first electrode electrically connected to the second electrode of the transistor used as the switch SW2 and includes a second electrode electrically connected to the first electrode of the transistor M.

A first electrode of the reflective element $10a(i,j)$ is electrically connected to the second electrode of the transistor used as the switch SW1. A second electrode of the reflective element $10a(i,j)$ is electrically connected to a wiring VCOM1. This enables the reflective element $10a(i,j)$ to be driven.

A first electrode of the light-emitting element $10b(i,j)$ is electrically connected to the second electrode of the transistor M. A second electrode of the light-emitting element $10b(i,j)$ is electrically connected to a wiring VCOM2. This enables the display element $10b(i,j)$ to be driven.

<Top View of Display Panel>

Figure 11A:
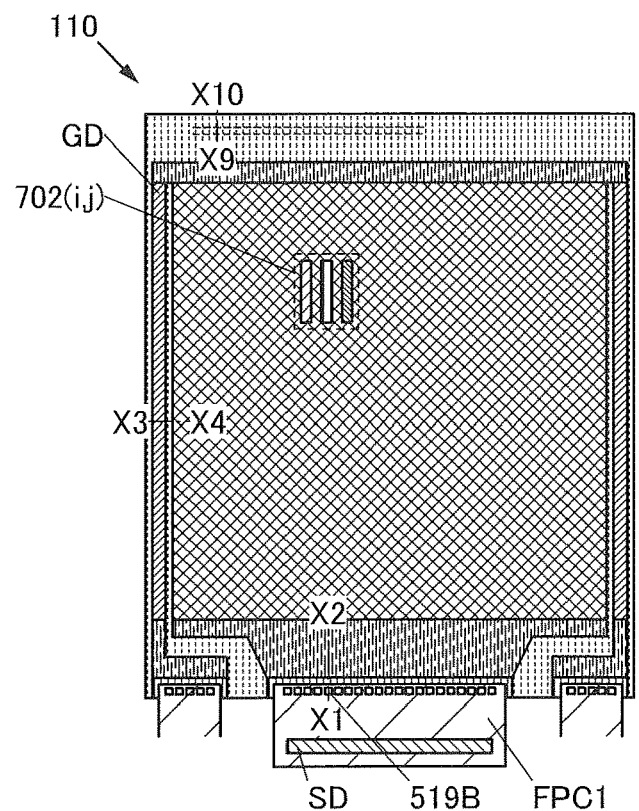
FIGS. 11A to 11C are top views illustrating a structure example of a display unit and a pixel.
Figure 11B:
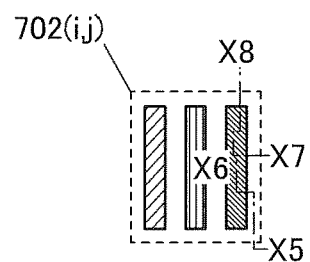
Figure 11C:
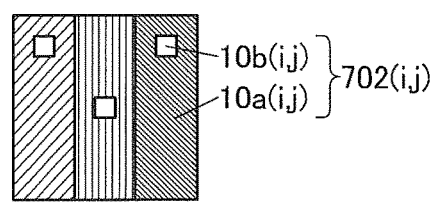

FIGS. 11A to 11C illustrate the structure of the display unit 110. FIG. 11A is a top view of the display unit 110. FIG. 11B is a top view illustrating one pixel of the display unit 110 illustrated in FIG. 11A. FIG. 11C is a schematic view illustrating the structure of the pixel illustrated in FIG. 11B.

In the example in FIG. 11A, the source driver SD and a terminal 519B are provided over a flexible printed circuit FPC1.

The pixel $702(i,j)$ in FIG. 11C includes the reflective element $10a(i,j)$ and the light-emitting element $10b(i,j)$.

<Cross-Sectional View of Display Panel>

Figure 12A:
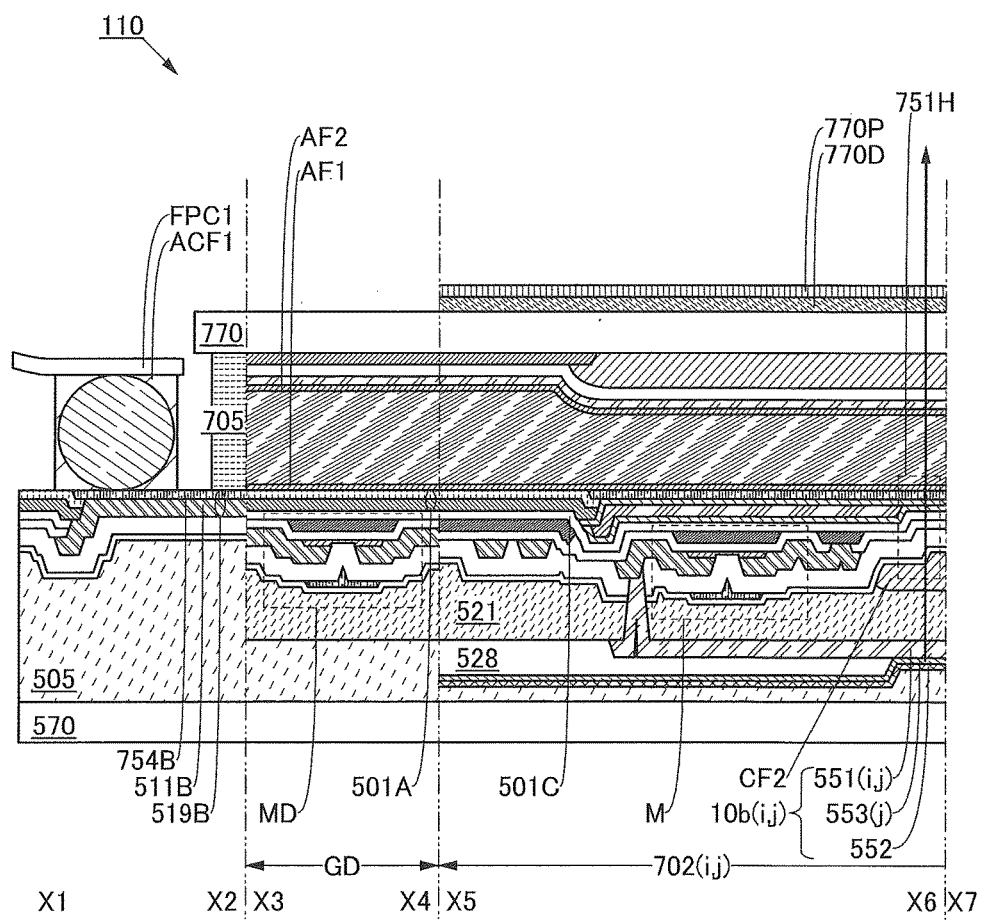
FIGS. 12A and 12B are cross-sectional views illustrating a structure example of a display unit.
Figure 12B:
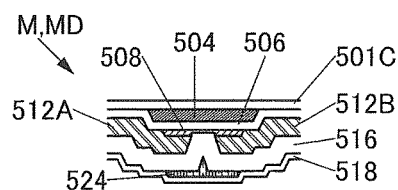

FIGS. 12A and 12B and FIGS. 13A and 13B are cross-sectional views illustrating the structure of the display unit 110. FIG. 12A is a cross-sectional view taken along lines X1-X2, X3-X4, and X5-X6 in FIG. 11A. FIG. 12B illustrates part of FIG. 12A.

Figure 13A:
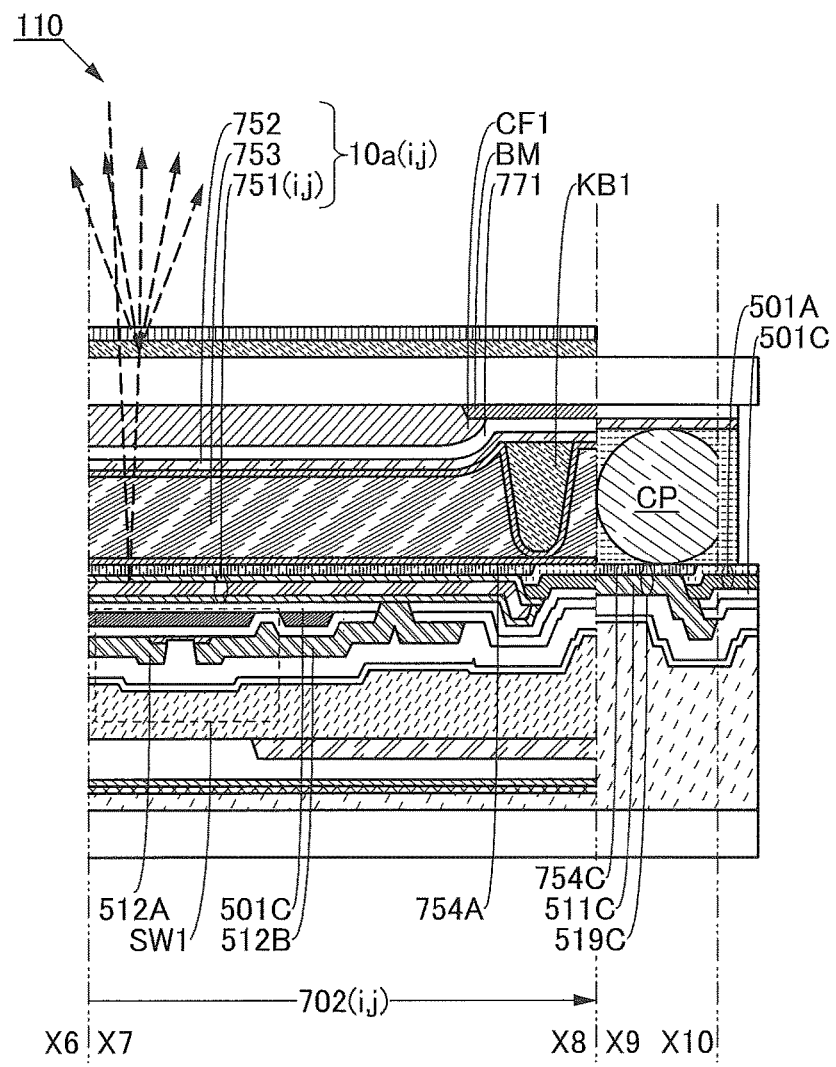
FIGS. 13A and 13B are cross-sectional views illustrating a structure example of a display unit.
Figure 13B:
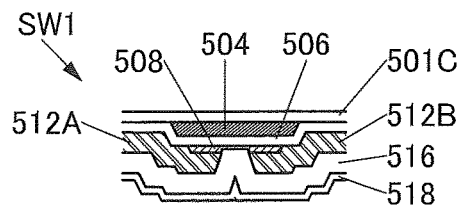

FIG. 13A is a cross-sectional view taken along lines X7-X8 and X9-X10 in FIG. 11B. FIG. 13B illustrates part of FIG. 13A.

Components of the display unit 110 will be described with reference to FIGS. 12A and 12B and FIGS. 13A and 13B.

<<Substrate 570>>

The substrate 570 or the like can be formed using a material having heat resistance high enough to withstand heat treatment in the manufacturing process. For example, a material having a thickness greater than or equal to 0.1 mm and less than or equal to 0.7 mm can be used as the substrate 570. Specifically, a material polished to a thickness of approximately 0.1 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramic, or metal can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, a silicon oxide film, a silicon nitride film, a silicon oxynitride film, an aluminum oxide film, or the like can be used for the substrate 570 or the like. Stainless steel, aluminum, or the like can be used for the substrate 570 or the like.

For example, a single crystal semiconductor substrate or a polycrystalline semiconductor substrate of silicon or silicon carbide, a compound semiconductor substrate of silicon germanium or the like, an SOI substrate, or the like can be used as the substrate 570 or the like. Thus, a semiconductor element can be provided over the substrate 570 or the like.

For example, an organic material such as a resin, a resin film, or plastic can be used for the substrate 570 or the like. Specifically, a resin film or a resin plate of polyester, polyolefin, polyamide, polyimide, polycarbonate, an acrylic resin, or the like can be used for the substrate 570 or the like.

For example, a composite material formed by attaching a metal plate, a thin glass plate, or a film of an inorganic material to a resin film or the like can be used for the substrate 570 or the like. For example, a composite material formed by dispersing a fibrous or particulate metal, glass, an inorganic material, or the like into a resin film can be used for the substrate 570 or the like. For example, a composite material formed by dispersing a fibrous or particulate resin, an organic material, or the like into an inorganic material can be used for the substrate 570 or the like.

Furthermore, a single-layer material or a layered material in which a plurality of layers are stacked can be used for the substrate 570 or the like. For example, a layered material in which a base, an insulating film that prevents diffusion of impurities contained in the base, and the like are stacked can be used for the substrate 570 or the like. Specifically, a layered material in which glass and one or a plurality of films that are selected from a silicon oxide layer, a silicon nitride layer, a silicon oxynitride layer, and the like and that prevent diffusion of impurities contained in the glass are stacked can be used for the substrate 570 or the like. Alternatively, a layered material in which a resin and a film for preventing diffusion of impurities that penetrate the resin, such as a silicon oxide film, a silicon nitride film, or a silicon oxynitride film, are stacked can be used for the substrate 570 or the like.

Specifically, a resin film, a resin plate, a layered material, or the like of polyester, polyolefin, polyamide, polyimide, polycarbonate, an acrylic resin, or the like can be used for the substrate 570 or the like.

Specifically, a material including polyester, polyolefin, polyamide (e.g., nylon or aramid), polyimide, polycarbonate, polyurethane, an acrylic resin, an epoxy resin, or a resin having a siloxane bond, such as silicone, can be used for the substrate 570 or the like.

Specifically, polyethylene terephthalate (PET), polyethylene naphthalate (PEN), polyethersulfone (PES), an acrylic resin, or the like can be used for the substrate 570 or the like. Alternatively, a cyclo olefin polymer (COP), a cyclo olefin copolymer (COC), or the like can be used.

Alternatively, paper, wood, or the like can be used for the substrate 570 or the like.

For example, a flexible substrate can be used as the substrate 570 or the like.

Note that a transistor, a capacitor, or the like can be directly formed on the substrate. Alternatively, a transistor, a capacitor, or the like can be formed on a substrate which is for use in the manufacturing process and can withstand heat applied in the manufacturing process, and then the transistor, the capacitor, or the like can be transferred to the substrate 570 or the like. Accordingly, a transistor, a capacitor, or the like can be formed over a flexible substrate.

<<Substrate 770>>

For example, a light-transmitting material can be used for the substrate 770. Specifically, any of the materials that can be used for the substrate 570 can be used for the substrate 770.

For example, aluminosilicate glass, tempered glass, chemically tempered glass, sapphire, or the like can be favorably used for the substrate 770 that is provided on the user side of the display panel. This can prevent damage or a crack of the display panel caused by the use thereof.

Moreover, a material having a thickness greater than or equal to 0.1 mm and less than or equal to 0.7 mm, for example, can be used for the substrate 770. Specifically, a substrate polished for reducing the thickness can be used. Thus, a functional film 770D can be provided so as to be close to the reflective element 10a(i,j). As a result, image blur can be reduced and an image can be displayed clearly.

<<Structure Body KB1>>

For example, an organic material, an inorganic material, or a composite material of an organic material and an inorganic material can be used for the structure body KB1 or the like. Accordingly, a predetermined space can be provided between components between which the structure KB1 and the like are provided.

Specifically, for the structure body KB1, polyester, polyolefin, polyamide, polyimide, polycarbonate, polysiloxane, an acrylic resin, or the like, or a composite material of a plurality of resins selected from these can be used. Alternatively, a photosensitive material may be used.

<<Sealant 705>>

For the sealant 705 or the like, an inorganic material, an organic material, a composite material of an inorganic material and an organic material, or the like can be used.

For example, an organic material such as a thermally fusible resin or a curable resin can be used for the sealant 705 or the like.

For example, an organic material such as a reactive curable adhesive, a light curable adhesive, a thermosetting adhesive, and/or an anaerobic adhesive can be used for the sealant 705 or the like.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, or the like can be used for the sealant 705 or the like.

<<Bonding Layer 505>>

For example, any of the materials that can be used for the sealant 705 can be used for a bonding layer 505.

<<Insulating Film 521 and Insulating Film 518>>

For example, an insulating inorganic material, an insulating organic material, or an insulating composite material containing an inorganic material and an organic material can be used for an insulating film 521, an insulating film 518, or the like.

Specifically, an inorganic oxide film, an inorganic nitride film, an inorganic oxynitride film, or a layered material obtained by stacking some of these films can be used as the insulating film 521, the insulating film 518, and the like. For example, a film including any of a silicon oxide film, a silicon nitride film, a silicon oxynitride film, an aluminum oxide film, and the like, or a film including a material obtained by stacking some of these films can be used as the insulating film 521, the insulating film 518, and the like.

Specifically, for the insulating film 521, the insulating film 518, and the like, polyester, polyolefin, polyamide, polyimide, polycarbonate, polysiloxane, an acrylic resin, or the like, or a layered or composite material of a plurality of kinds of resins selected from these can be used. Alternatively, a photosensitive material may be used.

Thus, steps due to various components overlapping with the insulating film 521 and the insulating film 518, for example, can be reduced.

<<Insulating Film 528>>

For example, any of the materials that can be used for the insulating film 521 can be used for an insulating film 528 or the like. Specifically, a 1-µm-thick polyimide-containing film can be used as the insulating film 528.

<<Insulating Film 501A>>

For example, any of the materials that can be used for the insulating film 521 can be used for an insulating film 501A. For example, a material having a function of supplying hydrogen can be used for the insulating film 501A.

Specifically, a material obtained by stacking a material containing silicon and oxygen and a material containing silicon and nitrogen can be used for the insulating film 501A. For example, a material having a function of releasing hydrogen by heating or the like to supply the hydrogen to another component can be used for the insulating film 501A. Specifically, a material having a function of releasing hydrogen taken in the manufacturing process, by heating or the like, to supply the hydrogen to another component can be used for the insulating film 501A.

For example, a film containing silicon and oxygen that is formed by a chemical vapor deposition method using silane or the like as a source gas can be used as the insulating film 501A.

Specifically, a material obtained by stacking a material containing silicon and oxygen and having a thickness greater than or equal to 200 nm and less than or equal to 600 nm and a material containing silicon and nitrogen and having a thickness of approximately 200 nm can be used for the insulating film 501A.

<<Insulating Film 501C>>

For example, any of the materials that can be used for the insulating film 521 can be used for an insulating film 501C. Specifically, a material containing silicon and oxygen can be used for the insulating film 501C. Thus, impurity diffusion into the pixel circuit, the second display element, or the like can be suppressed.

For example, a 200-nm-thick film containing silicon, oxygen, and nitrogen can be used as the insulating film 501C.

<<Intermediate Film 754A, Intermediate Film 754B, and Intermediate Film 754C>>

For example, a film having a thickness greater than or equal to 10 nm and less than or equal to 500 nm, preferably greater than or equal to 10 nm and less than or equal to 100 nm, can be used as an intermediate film 754A, an intermediate film 754B, or an intermediate film 754C. In this specification, the intermediate film 754A, the intermediate film 754B, or the intermediate film 754C is referred to as an intermediate film.

For example, a material having a function of allowing the passage of hydrogen or the supply of hydrogen can be used for the intermediate film.

For example, a conductive material can be used for the intermediate film.

For example, a light-transmitting material can be used for the intermediate film.

Specifically, a material containing indium and oxygen, a material containing indium, gallium, zinc, and oxygen, a material containing indium, tin, and oxygen, or the like can be used for the intermediate film. Note that these materials have a function of allowing the passage of hydrogen.

Specifically, a 50- or 100-nm-thick film containing indium, gallium, zinc, and oxygen can be used as the intermediate film.

Note that a material obtained by stacking films functioning as an etching stopper can be used as the intermediate film. Specifically, a layered material obtained by stacking a 50-nm-thick film containing indium, gallium, zinc, and oxygen and a 20-nm-thick film containing indium, tin, and oxygen, in this order, can be used for the intermediate film.

<<Wiring, Terminal, and Conductive Film>>

A conductive material can be used for a wiring or the like. Specifically, the conductive material can be used for the signal line $S1(j)$, the signal line $S2(j)$, the scan line $G1(i)$, the scan line $G2(i)$, the wiring CSCOM, the wiring ANO, a conductive film 511B, a conductive film 511C, or the like.

For example, an inorganic conductive material, an organic conductive material, a metal material, a conductive ceramic material, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film including graphene oxide is formed and is reduced, so that a film including graphene can be formed. As a reducing method, a method using heat, a method using a reducing agent, or the like can be employed.

For example, a film including a metal nanowire can be used for the wiring or the like. Specifically, a nanowire including silver can be used.

Specifically, a conductive high molecule can be used for the wiring or the like.

Note that the terminal 519B can be electrically connected to the flexible printed circuit FPC1 using a conductive material ACF1, for example.

<<Reflective Element $10a(i,j)$>>

The reflective element $10a(i,j)$ is a display element having a function of controlling reflection of light. For example, a liquid crystal element, an electrophoretic element, a display element using MEMS, or the like can be used. Specifically, a reflective liquid crystal display element can be used as the reflective element $10a(i,j)$. The use of a reflective display element can reduce the power consumption of a display panel.

For example, a liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The reflective element $10a(i,j)$ includes an electrode $751(i,j)$, an electrode 752, and a layer 753 containing a liquid crystal material. The layer 753 contains a liquid crystal material whose alignment is controlled by a voltage applied between the electrode $751(i,j)$ and the electrode 752. For example, the alignment of the liquid crystal material can be controlled by an electric field in the thickness direction (also referred to as the vertical direction) of the layer 753, or the direction that crosses the vertical direction (the horizontal direction, or the diagonal direction).

For example, thermotropic liquid crystal, low-molecular liquid crystal, high-molecular liquid crystal, polymer-dispersed liquid crystal, ferroelectric liquid crystal, anti-ferroelectric liquid crystal, or the like can be used for the layer 753 containing a liquid crystal material. A liquid crystal material that exhibits a cholesteric phase, a smectic phase, a cubic phase, a chiral nematic phase, an isotropic phase, or the like can be used. Alternatively, a liquid crystal material that exhibits a blue phase can be used.

For example, the material that is used for the wiring or the like can be used for the electrode $751(i,j)$. Specifically, a reflective film can be used for the electrode $751(i,j)$. For example, a material in which a light-transmitting conductive film and a reflective film having an opening are stacked can be used for the electrode $751(i,j)$.

For example, a material having conductivity can be used for the electrode 752. For example, a material having a visible-light-transmitting property can be used for the electrode 752.

For example, a conductive oxide, a metal film thin enough to transmit light, or a metal nanowire can be used for the electrode 752.

Specifically, a conductive oxide containing indium can be used for the electrode 752. Alternatively, a metal thin film having a thickness greater than or equal to 1 nm and less than or equal to 10 nm can be used for the electrode 752. Alternatively, a metal nanowire containing silver can be used for the electrode 752.

Specifically, indium oxide, indium tin oxide, indium zinc oxide, zinc oxide, zinc oxide to which gallium is added, zinc oxide to which aluminum is added, or the like can be used for the electrode 752.

<<Reflective Film>>

For example, a material reflecting visible light can be used for the reflective film. Specifically, a material containing silver can be used for the reflective film. For example, a material containing silver, palladium, and the like or a material containing silver, copper, and the like can be used for the reflective film.

The reflective film reflects light that passes through the layer 753, for example. This allows the reflective element $10a(i,j)$ to serve as a reflective display element. Alternatively, a material with an uneven surface can be used for the reflective film. In that case, incident light can be reflected in various directions so that a white image can be displayed.

For example, the electrode 751($i,j$), or the like can be used as a reflective film.

For example, the reflective film can be provided as a film including a region sandwiched between the layer 753 and the electrode 751($i,j$). In the case where the electrode 751($i,j$) has a light-transmitting property, the reflective film can be used as a film including a region provided so that the electrode 751($i,j$) is positioned between the region and the layer 753.

The reflective film preferably has a shape, for example, including a region that does not block light emitted from the light-emitting element 10$b$($i,j$). For example, the reflective film may have a shape with one or a plurality of openings 751H.

The opening may have a polygonal shape, a quadrangular shape, an elliptical shape, a circular shape, a cross-like shape, or the like. The opening 751H may also have a stripe shape, a slit-like shape, or a checkered pattern.

If the ratio of the total area of the opening 751H to the total area except for the openings is too high, display performed using the reflective element 10$a$($i,j$) is dark.

If the ratio of the total area of the opening 751H to the total area except for the openings is too low, display performed using the light-emitting element 10$b$($i,j$) is dark.

Figure 14A:
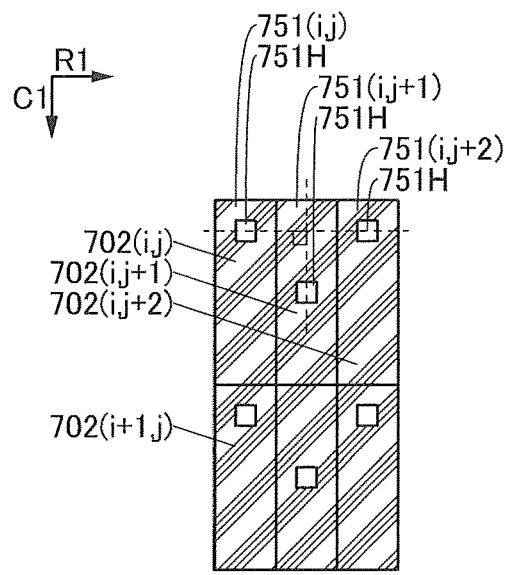
FIGS. 14A to 14C are schematic views illustrating the shapes of reflective films.
Figure 14B:
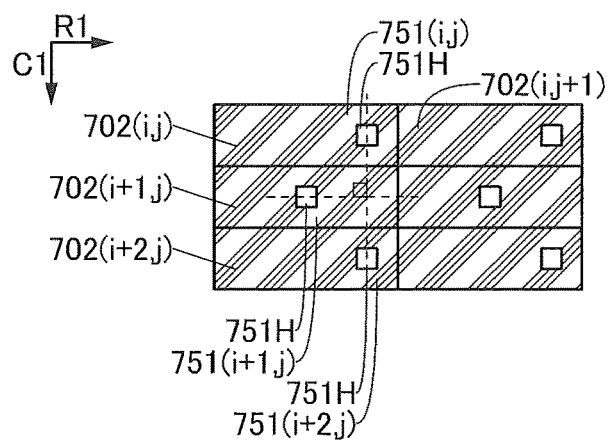
Figure 14C:
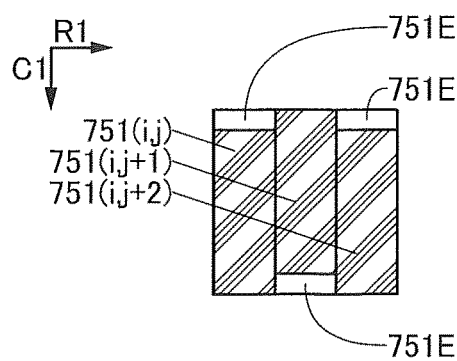

FIGS. 14A to 14C are schematic views each illustrating the shape of a reflective film that can be used in a pixel of the display unit 110.

The opening 751H of the pixel 702($i,j$+1), which is adjacent to the pixel 702($i,j$), is not provided on a line that extends in the row direction (the direction indicated by the arrow R1 in each of FIGS. 14A to 14C) through the opening 751H of the pixel 702($i,j$) (see FIG. 14A). Alternatively, for example, the opening 751H of the pixel 702($i$+1,$j$), which is adjacent to the pixel 702($i,j$), is not provided on a line that extends in the column direction (the direction indicated by the arrow C1 in each of FIGS. 14A to 14C) through the opening 751H of the pixel 702($i,j$) (see FIG. 14B).

For example, the opening 751H of the pixel 702($i,j$+2) is provided on a line that extends in the row direction through the opening 751H of the pixel 702($i,j$) (see FIG. 14A). In addition, the opening 751H of the pixel 702($i,j$+1) is provided on a line that is perpendicular to the above-mentioned line between the opening 751H of the pixel 702($i,j$) and the opening 751H of the pixel 702($i,j$+2).

Alternatively, for example, the opening 751H of the pixel 702($i$+2,j) is provided on a line that extends in the column direction through the opening 751H of the pixel 702($i,j$) (see FIG. 14B). In addition, for example, the opening 751H of the pixel 702($i$+1,$j$) is provided on a line that is perpendicular to the above-mentioned line between the opening 751H of the pixel 702($i,j$) and the opening 751H of the pixel 702($i$+2,$j$).

Thus, the second display element that includes a region overlapping with an opening of a pixel adjacent to one pixel can be apart from the second display element that includes a region overlapping with an opening of the one pixel. Furthermore, a display element that exhibits color different from that exhibited by the second display element of the one pixel can be provided as the second display element of the pixel adjacent to the one pixel. Furthermore, the difficulty in adjacently arranging a plurality of display elements that exhibit different colors can be lowered.

For example, the reflective film can be formed using a material having a shape in which an end portion is cut off so as to form a region 751E that does not block light emitted from the light-emitting element 10$b$($i,j$) (see FIG. 14C). Specifically, the electrode 751($i,j$) whose end portion is cut off so as to be shorter in the column direction (the direction indicated by the arrow C1 in the drawing) can be used as the reflective film.

<<Alignment Film AF1 and Alignment Film AF2>>

For example, an alignment film AF1 and an alignment film AF2 can be formed with a material containing polyimide or the like. Specifically, a material formed by rubbing treatment or an optical alignment technique so that a liquid crystal material has alignment in a predetermined direction can be used.

For example, a film containing soluble polyimide can be used as the alignment film AF1 or the alignment film AF2. In this case, the temperature required in forming the alignment film AF1 or the alignment film AF2 can be low. Accordingly, damage to other components at the time of forming the alignment film AF1 or the alignment film AF2 can be suppressed.

<<Coloring Film CF1 and Coloring Film CF2>>

A material transmitting light of a predetermined color can be used for a coloring film CF1 or a coloring film CF2. Thus, the coloring film CF1 or the coloring film CF2 can be used as a color filter, for example. For example, a material that transmits blue light, green light, or red light can be used for the coloring film CF1 or the coloring film CF2. Furthermore, a material that transmits yellow light, white light, or the like can be used for the coloring film CF1 or the coloring film CF2.

Note that a material having a function of converting the emitted light to a predetermined color light can be used for the coloring film CF2. Specifically, quantum dots can be used for the coloring film CF2. Thus, display with high color purity can be achieved.

<<Light-Blocking Film BM>>

A material that prevents light transmission can be used for a light-blocking film BM. Thus, the light-blocking film BM can be used as, for example, a black matrix.

<<Insulating Film 771>>

An insulating film 771 can be formed of polyimide, an epoxy resin, or an acrylic resin, for example.

<<Functional Film 770P and Functional Film 770D>>

For example, an anti-reflection film, a polarizing film, a retardation film, a light diffusion film, a condensing film, or the like can be used as a functional film 770P or the functional film 770D.

Specifically, a film containing a dichromatic pigment can be used as the functional film 770P or the functional film 770D. Furthermore, a material having a pillar-shaped structure with an axis in a direction that intersects a surface of the substrate can be used for the functional film 770P or the functional film 770D. This makes it easy to transmit light in a direction along the axis and to scatter light in the other directions.

Alternatively, an antistatic film preventing the attachment of a foreign substance, a water repellent film suppressing the attachment of stain, a hard coat film suppressing a scratch in use, or the like can be used as the functional film 770P.

Specifically, a circularly polarizing film can be used as the functional film 770P. Furthermore, a light diffusion film can be used as the functional film 770D.

<<Light-Emitting Element 10$b$($i,j$)>>

For example, an organic EL element, an inorganic EL element, a light-emitting diode, or the like can be used as the light-emitting element 10$b$($i,j$).

The light-emitting element 10b(i,j) includes an electrode 551(i,j), an electrode 552, and a layer 553(j) containing a light-emitting material.

For example, a light-emitting organic compound can be used for the layer 553(j) containing a light-emitting material.

For example, quantum dots can be used for the layer 553(j). Accordingly, the half width becomes narrow, and light of a bright color can be emitted.

For example, a layered material for emitting blue light, green light, or red light, or the like can be used for the layer 553(j).

For example, a belt-like layered material that extends in the column direction along the signal line S2(j) can be used for the layer 553(j).

Alternatively, a layered material for emitting white light can be used for the layer 553(j). Specifically, a layered material in which a layer containing a light-emitting material including a fluorescent material that emits blue light, and a layer containing materials that are other than a fluorescent material and that emit green light and/or red light or a layer containing a material that is other than a fluorescent material and that emits yellow light are stacked can be used for the layer 553(j).

For example, a material that can be used for the wiring or the like can be used for the electrode 551(i,j).

For example, a material that transmits visible light selected from materials that can be used for the wiring or the like can be used for the electrode 551(i,j).

Specifically, conductive oxide, indium-containing conductive oxide, indium oxide, indium tin oxide, indium zinc oxide, zinc oxide, zinc oxide to which gallium is added, or the like can be used for the electrode 551(i,j). Alternatively, a metal film that is thin enough to transmit light can be used as the electrode 551(i,j). Further alternatively, a metal film that transmits part of light and reflects another part of light can be used as the electrode 551(i,j). Thus, the light-emitting element 10b(i,j) can be provided with a microcavity structure. Consequently, light of a predetermined wavelength can be extracted more efficiently than light of the other wavelengths.

For example, a material that can be used for the wiring or the like can be used for the electrode 552. Specifically, a material that reflects visible light can be used for the electrode 552.

<<Gate Driver GD>>

Any of a variety of sequential circuits, such as a shift register, can be used as the gate driver GD. For example, a transistor MD, a capacitor, and the like can be used in the gate driver GD. Specifically, a transistor including a semiconductor film that can be formed in the same process as the semiconductor film of the transistor M or the transistor which can be used as the switch SW1 can be used.

As the transistor MD, a transistor having a different structure from the transistor that can be used as the switch SW1 can be used, for example. Specifically, a transistor including a conductive film 524 can be used as the transistor MD.

Note that the transistor MD can have the same structure as the transistor M.

<<Transistor>>

For example, semiconductor films formed at the same step can be used for transistors in the gate driver, the source driver, and the pixel circuit.

For example, a bottom-gate transistor, a top-gate transistor, or the like can be used for transistors in the gate driver, the source driver, or a pixel circuit.

For example, the OS transistor described in Embodiment 1 can be used. Thus, the above idling stop can be performed.

For example, a transistor including an oxide semiconductor film 508, a conductive film 504, a conductive film 512A, and a conductive film 512B can be used as the switch SW1 (see FIG. 13B). Note that an insulating film 506 includes a region sandwiched between the oxide semiconductor film 508 and the conductive film 504.

The conductive film 504 includes a region overlapping with the oxide semiconductor film 508. The conductive film 504 has a function of a gate electrode. The insulating film 506 has a function of a gate insulating film.

The conductive film 512A and the conductive film 512B are electrically connected to the oxide semiconductor film 508. The conductive film 512A has one of a function of a source electrode and a function of a drain electrode, and the conductive film 512B has the other.

A transistor including the conductive film 524 can be used as the transistor in the gate driver, the source driver, or the pixel circuit. The conductive film 524 includes a region so that the oxide semiconductor film 508 is sandwiched between the conductive film 504 and the region. Note that an insulating film 516 includes a region sandwiched between the conductive film 524 and the oxide semiconductor film 508. For example, the conductive film 524 is electrically connected to a wiring that supplies the same potential as that supplied to the conductive film 504.

A conductive film in which a 10-nm-thick film containing tantalum and nitrogen and a 300-nm-thick film containing copper are stacked in this order can be used as the conductive film 504, for example. Note that the film containing copper includes a region so that the film containing tantalum and nitrogen is sandwiched between the region and the insulating film 506.

A material in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region so that the film containing silicon, oxygen, and nitrogen is sandwiched between the region and the oxide semiconductor film 508.

A 25-nm-thick film containing indium, gallium, and zinc can be used as the oxide semiconductor film 508, for example.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the oxide semiconductor film 508.

This embodiment can be combined with any other embodiment in this specification as appropriate.

Figure 15A:
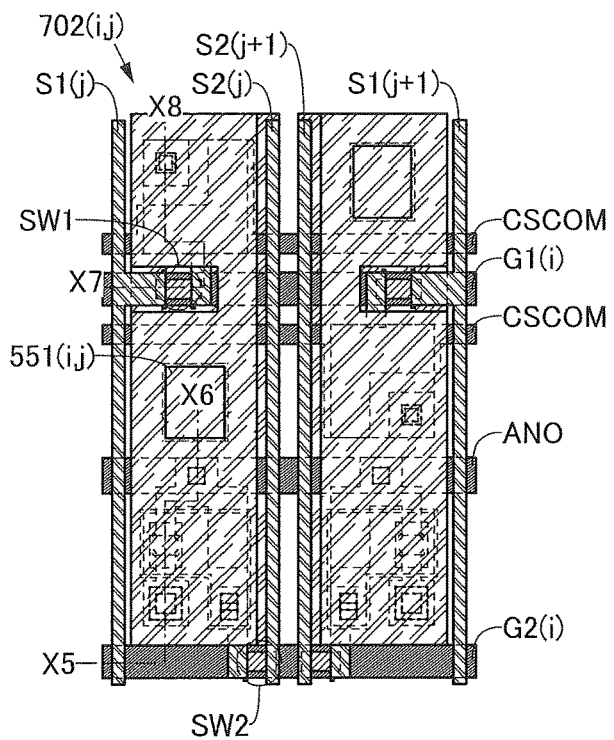
FIGS. 15A and 15B are bottom views each illustrating part of a pixel of a display unit.
Figure 15B:
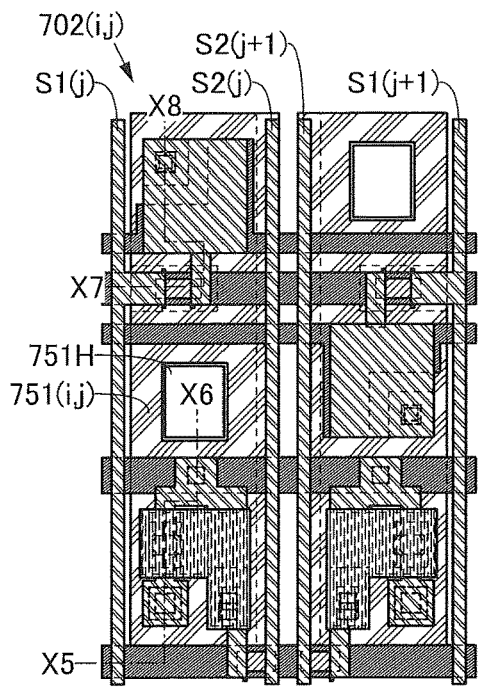

FIG. 15A is a bottom view illustrating part of the pixel of the display panel in FIG. 11B. FIG. 15B is a bottom view illustrating part of the structure in FIG. 15A in which some components are omitted.

Embodiment 3

A display device described in this embodiment includes the display unit described in the above embodiments and a touch sensor unit.

Figure 16:
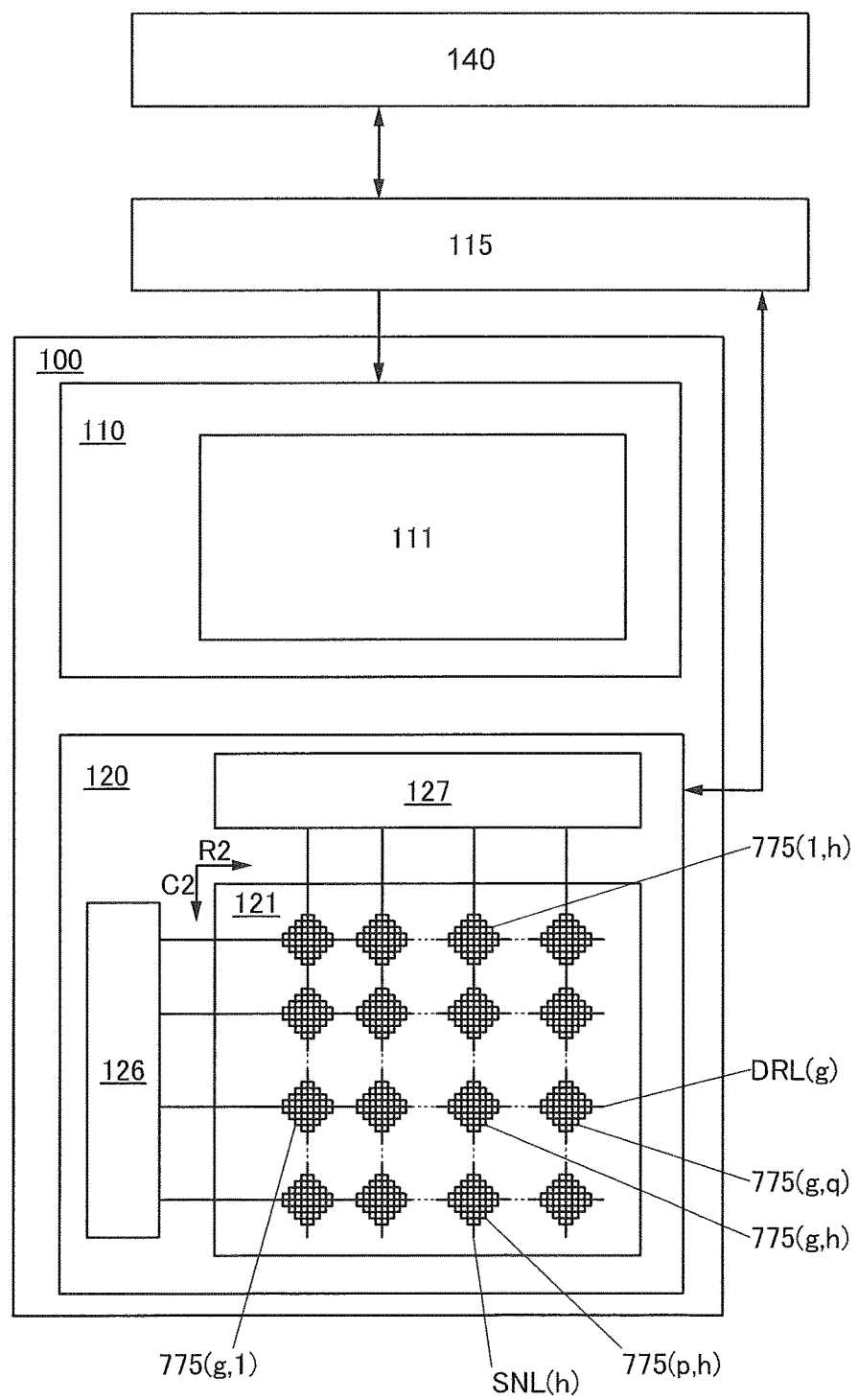
FIG. 16 is a block diagram illustrating a structure example of a display device.
Figure 17A:
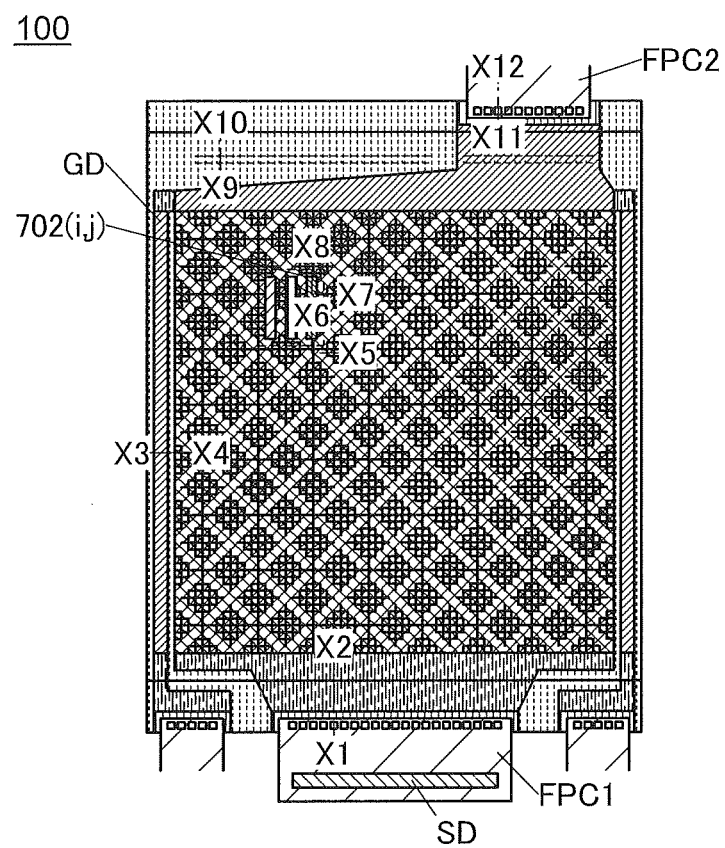
FIGS. 17A and 17B are a top view illustrating a display device and a schematic view illustrating part of an input portion of the display device.
Figure 17B:
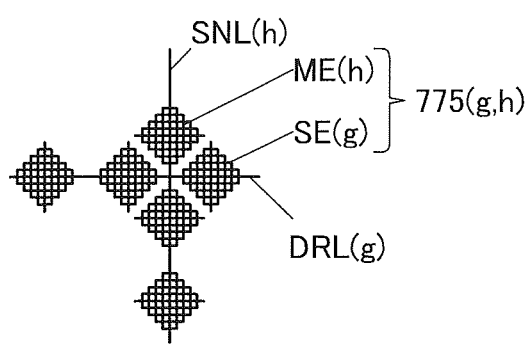

FIG. 16 is a block diagram showing the structure of the display device 100 including the touch sensor unit 120 and the display unit 110. FIG. 17A is a top view of the display device 100. FIG. 17B is a schematic view showing part of an input portion of the display device 100.

The touch sensor unit 120 includes the sensor array 121, the TS driver 126, and the sensing circuit 127 (see FIG. 16).

The sensor array 121 includes a region overlapping with the pixel array 111 of the display unit 110. The sensor array 121 has a function of sensing an object approaching the region overlapping with the pixel array 111.

The sensor array 121 includes a group consisting of sensing elements 775(g,1) to 775(g,q) and another group consisting of sensing elements 775(1,h) to 775(p,h). Note that g is an integer greater than or equal to 1 and less than or equal to p, h is an integer greater than or equal to 1 and less than or equal to q, and each of p and q is an integer greater than or equal to 1.

The one group of the sensing elements 775(g,1) to 775(g,q) include the sensing element 775(g,h). The sensing elements 775(g,1) to 775(g,q) are arranged in a row direction (indicated by the arrow R2 in the drawing).

The another group of sensing elements 775(1,h) to 775(p,h) include the sensing element 775(g,h) and are provided in the column direction (the direction indicated by the arrow C2 in the drawing) that intersects the row direction.

The one group of sensing elements 775(g,1) to 775(g,q) provided in the row direction include an electrode SE(g) that is electrically connected to a control line DRL(g) (see FIG. 17B).

The another group of sensing elements 775(1,h) to 775(p,h) provided in the column direction include an electrode ME(h) that is electrically connected to the sensor signal line SNL(h) (see FIG. 17B).

The electrode SE(g) and the electrode ME(h) preferably have light-transmitting properties.

The wiring DRL(g) has a function of supplying a control signal.

The wiring SNL(h) has a function of receiving a sensor signal.

The electrode ME(h) is provided so that an electric field can be formed between the electrode ME(h) and the electrode SE(g). When an object such as a finger approaches the sensor array 121, the electric field is blocked, and the sensing element 775(g,h) supplies the sensor signal.

The TS driver 126 is electrically connected to the wiring DRL(g) and has a function of supplying the control signal. For example, a rectangular wave, a sawtooth wave, a triangular wave, or the like can be used for the control signal.

The sensing circuit 127 is electrically connected to the wiring SNL(h) and has a function of supplying the sensor signal on the basis of change in the potential of the wiring SNL(h). Note that the sensor signal includes, for example, positional data.

The sensor signal is supplied to the controller IC 115. The controller IC 115 supplies data corresponding to the sensor signal to the host 140 to update the image displayed with the pixel array 111.

Figure 18A:
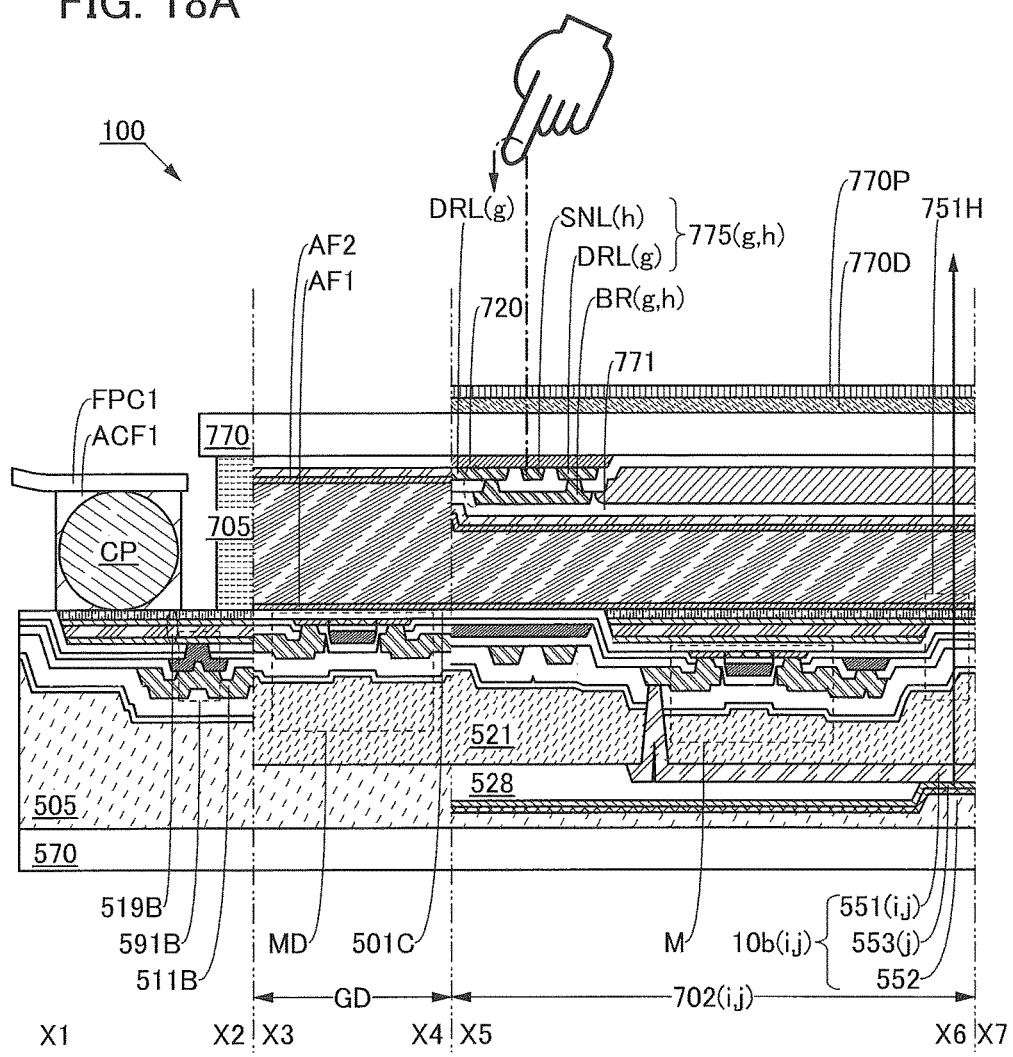
FIGS. 18A and 18B are cross-sectional views illustrating a structure example of a display device.
Figure 18B:
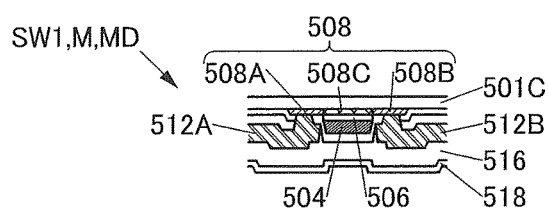
Figure 19:
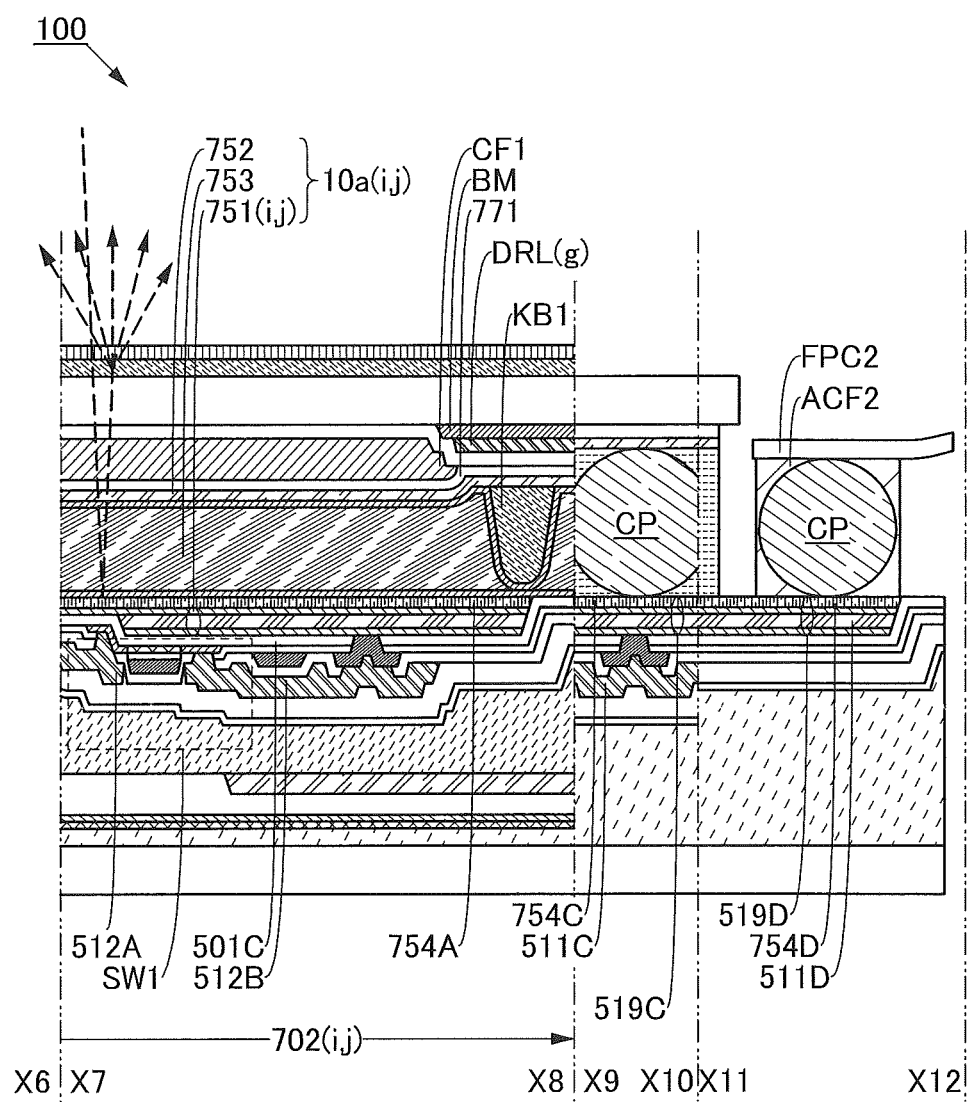
FIG. 19 is a cross-sectional view illustrating a structure example of a display device.

FIGS. 18A and 18B and FIG. 19 illustrate the structure of the display device 100. FIG. 18A is a cross-sectional view taken along lines X1-X2, X3-X4, and X5-X6 in FIG. 17A. FIG. 18B is a cross-sectional view illustrating part of the structure illustrated in FIG. 18A.

FIG. 19 is a cross-sectional view taken along lines X7-X8, X9-X10, and X11-X12 in FIG. 17A.

The display device 100 is different from, for example, the display unit 110 in Embodiment 2 in including a functional layer 720 and a top-gate transistor. Different structures will be described in detail below, and the above description is referred to for the other similar structures.

The functional layer 720 includes a region surrounded by the substrate 770, the insulating film 501C, and the sealant 705 (FIGS. 18A and 18B).

The functional layer 720 includes the wiring DRL(g), the wiring SNL(h), and the sensing element 775(g,h).

The gap between the wiring DRL(g) and the electrode 752 or between the wiring SNL(h) and the electrode 752 is greater than or equal to 0.2 μm and less than or equal to 16 μm, preferably greater than or equal to 1 μm and less than or equal to 8 μm, and further preferably greater than or equal to 2.5 μm and less than or equal to 4 μm.

The display device 100 includes a conductive film 511D (see FIG. 19).

Note that a conductive material CP or the like can be provided between the wiring DRL(g) and the conductive film 511D to electrically connect the wiring DRL(g) and the conductive film 511D. Alternatively, the conductive material CP or the like can be provided between the wiring SNL(h) and the conductive film 511D to electrically connect the wiring SNL(h) and the conductive film 511D. A material that can be used for the wiring or the like can be used for the conductive film 511D, for example.

The display device 100 includes a terminal 519D (see FIG. 19).

The terminal 519D is provided with the conductive film 511D and an intermediate film 754D, and the intermediate film 754D includes a region in contact with the conductive film 511D.

A material that can be used for the wiring or the like can be used for the terminal 519D, for example. Specifically, the terminal 519D can have the same structure as the terminal 519B or the terminal 519C.

Note that the terminal 519D can be electrically connected to a flexible printed circuit FPC2 using a conductive material ACF2, for example. Thus, a control signal can be supplied to the wiring DRL(g) with the use of the terminal 519D, for example. Alternatively, a sensor signal can be supplied from the wiring SNL(h) with the use of the terminal 519D.

A transistor that can be used as the switch SW1, the transistor M, and the transistor MD each include the conductive film 504 having a region overlapping with the insulating film 501C and the oxide semiconductor film 508 having a region sandwiched between the insulating film 501C and the conductive film 504. Note that the conductive film 504 functions as a gate electrode (see FIG. 18B).

The oxide semiconductor an 508 includes a first region 508A, a second region 508B, and a third region 508C. The first region 508A and the second region 508B do not overlap with the conductive film 504. The third region 508C is positioned between the first region 508A and the second region 508B and overlaps with the conductive film 504.

The transistor MD includes the insulating film 506 between the third region 508C and the conductive film 504. Note that the insulating film 506 functions as a gate insulating film.

The first region 508A and the second region 508B have a lower resistivity than that of the third region 508C, and function as a source region and a drain region.

For example, an oxide semiconductor film is subjected to plasma treatment using a gas including a rare gas, so that the first region 508A and the second region 508B can be formed in the oxide semiconductor film 508.

For example, the conductive film 504 can be used for a mask. Thus, part of the third region 508C can be formed into a shape of an end of the conductive film 504 in a self-aligned manner.

The transistor MD includes the conductive film 512A and the conductive film 512B that are in contact with the first region 508A and the second region 508B, respectively. The conductive film 512A and the conductive film 512B function as a source electrode and a drain electrode.

A transistor that can be formed in the same process as the transistor MD can be used as the transistor M, for example.

Embodiment 4

In this embodiment, electronic devices including the display device of one embodiment of the present invention will be described with reference to FIGS. 20A to 20H.

FIGS. 20A to 20G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 20A:
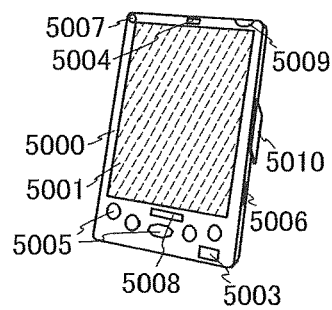
FIGS. 20A to 20H are perspective views each illustrating an example of an electronic device.
Figure 20B:
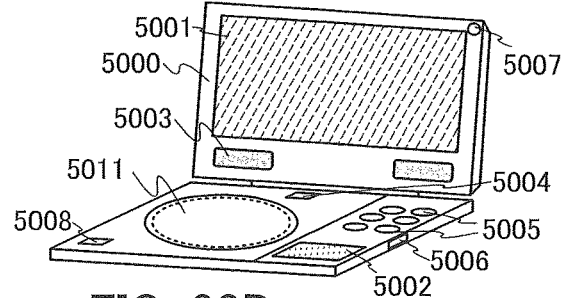
Figure 20C:
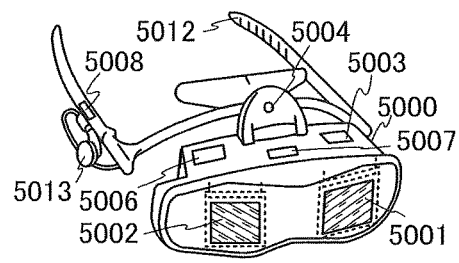
Figure 20D:
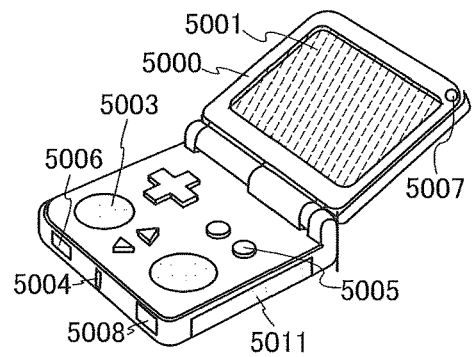
Figure 20E:
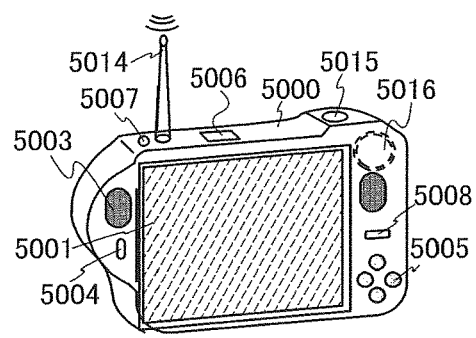
Figure 20F:
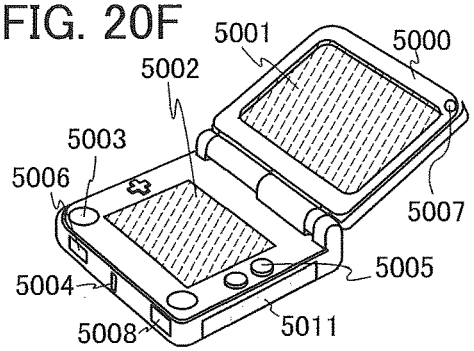
Figure 20G:
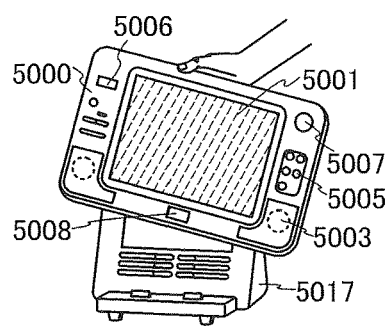

FIG. 20A illustrates a mobile computer that can include a switch 5009, an infrared port 5010, and the like in addition to the above components. FIG. 20B illustrates a portable image reproducing device (e.g., a DVD reproducing device) provided with a recording medium, and the portable image reproducing device can include a second display portion 5002, a recording medium reading portion 5011, and the like in addition to the above components. FIG. 20C illustrates a goggle-type display that can include the second display portion 5002, a support portion 5012, an earphone 5013, and the like in addition to the above components. FIG. 20D illustrates a portable game console that can include the recording medium reading portion 5011 and the like in addition to the above components. FIG. 20E illustrates a digital camera with a television reception function, and the digital camera can include an antenna 5014, a shutter button 5015, an image receiving portion 5016, and the like in addition to the above components. FIG. 20F illustrates a portable game console that can include the second display portion 5002, the recording medium reading portion 5011, and the like in addition to the above components. FIG. 20G illustrates a portable television receiver that can include a charger 5017 capable of transmitting and receiving signals, and the like in addition to the above components.

The electronic devices illustrated in FIGS. 20A to 20G can have a variety of functions. For example, the electronic devices illustrated in FIGS. 20A to 20G can have a variety of functions, for example, a function of displaying a variety of data (a still image, a moving image, a text image, and the like) on the display portion, a touch panel function, a function of displaying a calendar, date, time, and the like, a function of controlling processing with a variety of software (programs), a wireless communication function, a function of connecting to a variety of computer networks with a wireless communication function, a function of transmitting and receiving a variety of data with a wireless communication function, and a function of reading a program or data stored in a storage medium and displaying the program or data on the display portion. Furthermore, the electronic device including a plurality of display portions can have a function of displaying image data mainly on one display portion while displaying text data mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 20A to 20G are not limited thereto, and the electronic devices can have a variety of functions.

Figure 20H:
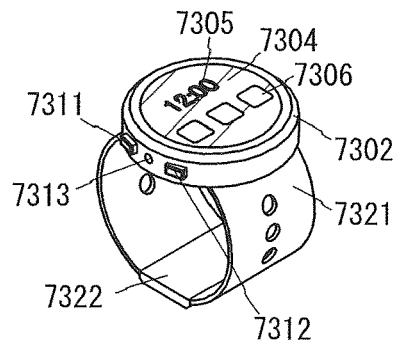

FIG. 20H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 20H can have a variety of functions such as a function of displaying a variety of data (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

Embodiment 5

In this embodiment, a field-programmable gate array (FPGA) using an OS transistor will be described. In an FPGA of this embodiment, an OS memory is used for a configuration memory and a register. Here, such an FPGA is referred to as an "OS-FPGA".

The OS memory is a memory including at least a capacitor and an OS transistor that controls charge and discharge of the capacitor. The OS memory has excellent retention characteristics because the OS transistor has an extremely low off-state current and thus can function as a nonvolatile memory.

Figure 21A:
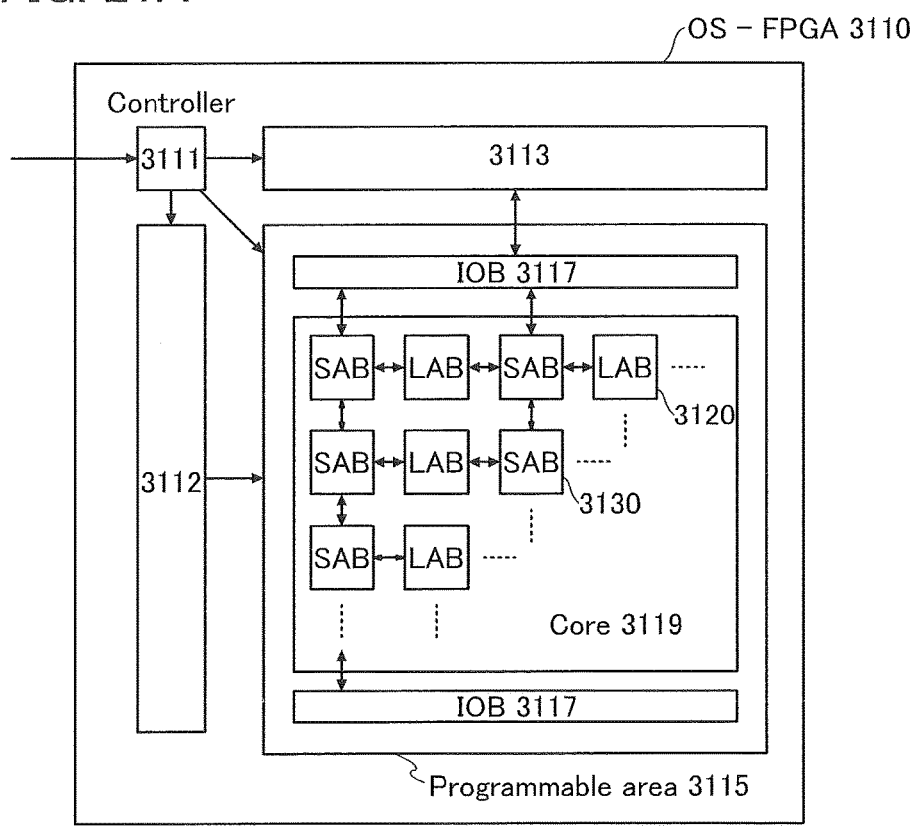
FIG. 21A is a block diagram illustrating a configuration example of an OS-FPGA.

FIG. 21A illustrates a configuration example of an OS-FPGA. An OS-FPGA 3110 illustrated in FIG. 21A is capable of normally-off computing for context switching by a multi-context configuration and fine-grained power gating in each PLE. The OS-FPGA 3110 includes a controller 3111, a word driver 3112, a data driver 3113, and a programmable area 3115.

Figure 21B:
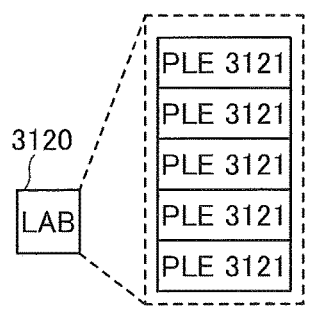
FIG. 21B is a block diagram illustrating a configuration example of an LAB.
Figure 21C:
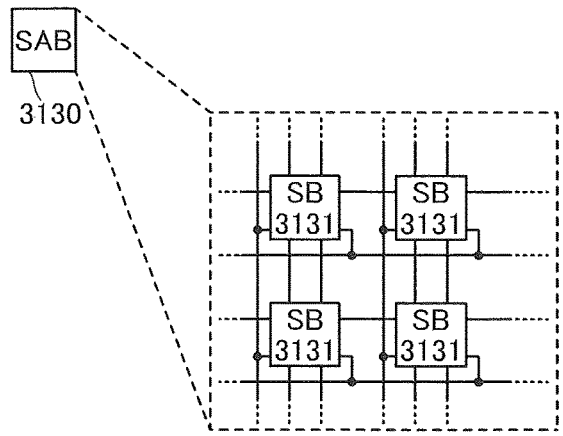
FIG. 21C is a block diagram illustrating a configuration example of an SAB.

The programmable area 3115 includes two input/output blocks (IOBs) 3117 and a core 3119. The IOB 3117 includes a plurality of programmable input/output circuits. The core 3119 includes a plurality of logic array blocks (LABs) 3120 and a plurality of switch array blocks (SABs) 3130. The LAB 3120 includes a plurality of PLEs 3121. FIG. 21B illustrates an example in which the LAB 3120 includes five PLEs 3121. As illustrated in FIG. 21C, the SAB 3130 includes a plurality of switch blocks (SBs) 3131 arranged in array. The LAB 3120 is connected to the LABs 3120 in four directions (on the left, right, top, and bottom sides) through its input terminals and the SABs 3130.

Figure 22A:
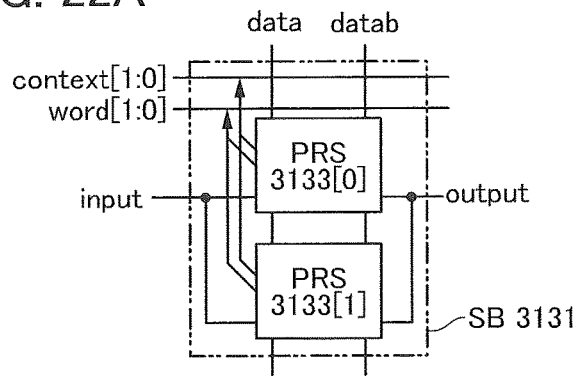
FIG. 22A is a block diagram illustrating a configuration example of an SB.

The SB 3131 is described with reference to FIGS. 22A to 22C. To the SB 3131, data, datab, signals context[1:0], and signals word[1:0] are input. The data and the datab are configuration data, and the logics of the data and the datab are complementary to each other. The number of contexts in the OS-FPGA 3110 is two, and the signals context[1:0] are context selection signals. The signals word[1:0] are word line selection signals, and wirings to which the signals word[1:0] are input are each a word line.

The SB 3131 includes a programmable routing switch (PRS) 3133[0] and a PRS 3133[1]. The PRS 3133[0] and the PRS 3133[1] each include a configuration memory (CM) that can store complementary data. Note that in the case where the PRS 3133[0] and the PRS 3133[1] are not distinguished from each other, they are each referred to as a PRS 3133. The same applies to other elements.

Figure 22B:
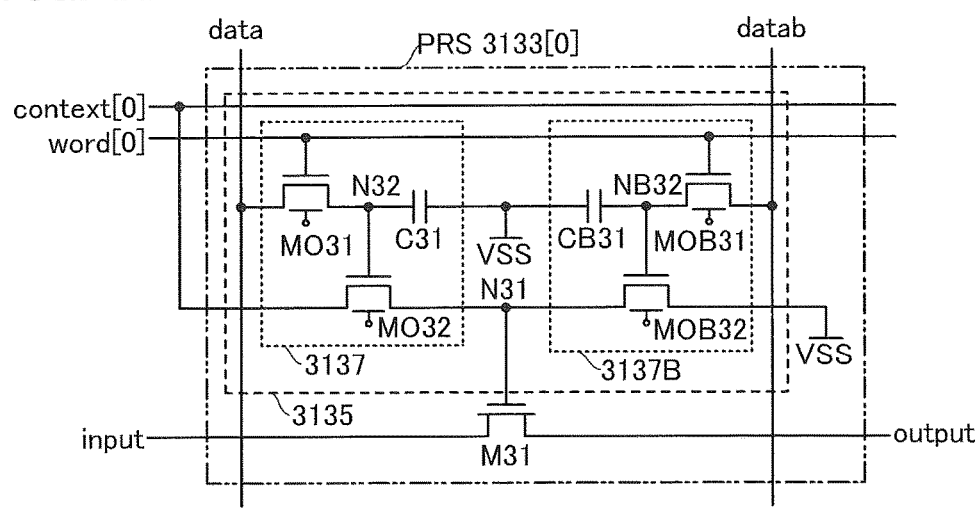
FIG. 22B is a circuit diagram illustrating a configuration example of a PRS.
Figure 22C:
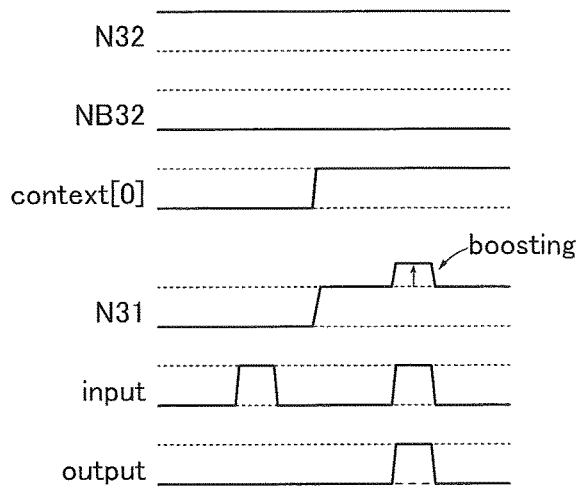
FIG. 22C is a timing chart illustrating an operation example of the PRS.

FIG. 22B illustrates a circuit configuration example of the PRS 3133[0]. The PRS 3133[0] and the PRS 3133[1] have the same circuit configuration. The PRS 3133[0] and the PRS 3133[1] are different from each other in a context selection signal and a word line selection signal which are input. The signal context[0] and the signal word[0] are input to the PRS 3133[0], and the signal context[1] and the signal word[1] are input to the PRS 3133[1]. For example, in the SB 3131, when the signal context[0] is set to "H", the PRS 3133[0] is activated.

The PRS 3133[0] includes a CM 3135 and a Si transistor M31. The Si transistor M31 is a pass transistor that is controlled by the CM 3135. The CM 3135 includes a memory circuit 3137 and a memory circuit 3137B. The memory circuit 3137 and the memory circuit 3137B have the same circuit configuration. The memory circuit 3137 includes a capacitor C31, an OS transistor MO31, and an OS transistor MO32. The memory circuit 3137B includes a capacitor CB31, an OS transistor MOB31, and an OS transistor MOB32.

The OS transistors MO31, MO32, MOB31, and MOB32 each include a back gate, and these back gates are electrically connected to power supply lines that each supply a fixed voltage.

A gate of the Si transistor M31, a gate of the OS transistor MO32, and a gate of the OS transistor MOB32 correspond to a node N31, a node N32, and a node NB32, respectively. The node 32 and the node NB32 are each a charge retention node of the CM 3135. The OS transistor MO32 controls the conduction state between the node N31 and a signal line for the signal context[0]. The OS transistor MOB32 controls the conduction state between the node N31 and a low-potential power supply line VSS.

A logic of data that the memory circuit 3137 retains and a logic of data that the memory circuit 3137B retains are complementary to each other. Thus, either the OS transistor MO32 or the OS transistor MOB32 is turned on.

The operation example of the PRS 3133[0] is described with reference to FIG. 22C. In the PRS 3133[0], in which configuration data has already been written, the node N32 of the PRS 3133[0] is at "H", whereas the node NB32 is at "L".

The PRS 3133[0] is inactivated while the signal context [0] is at "L". During this period, even when an input terminal of the PRS 3133[0] is transferred to "H", the gate of the Si transistor M31 is kept at "L" and an output terminal of the PRS 3133[0] is also kept at "L".

The PRS 3133[0] is activated while the signal context[0] is at "H". When the signal context[0] is transferred to "H", the gate of the Si transistor M31 is transferred to "H" by the configuration data stored in the CM 3135.

When the input terminal is transferred to "H" during a period in which the PRS 3133[0] is activated, the gate voltage of the Si transistor M31 is further increased by boosting. The OS transistor MO32 is turned off, and the gate of the Si transistor M31 is brought into a floating state. Since the Si transistor M31 is on, the output terminal is transferred from "L" to "H". A voltage between the gate of the Si transistor M31 and the output terminal does not become smaller than the threshold voltage of the Si transistor M31 because a high voltage is applied to the gate of the Si transistor M31 at this time. That is, the signal "H" of the input terminal is accurately transmitted to the output terminal.

Figure 23:
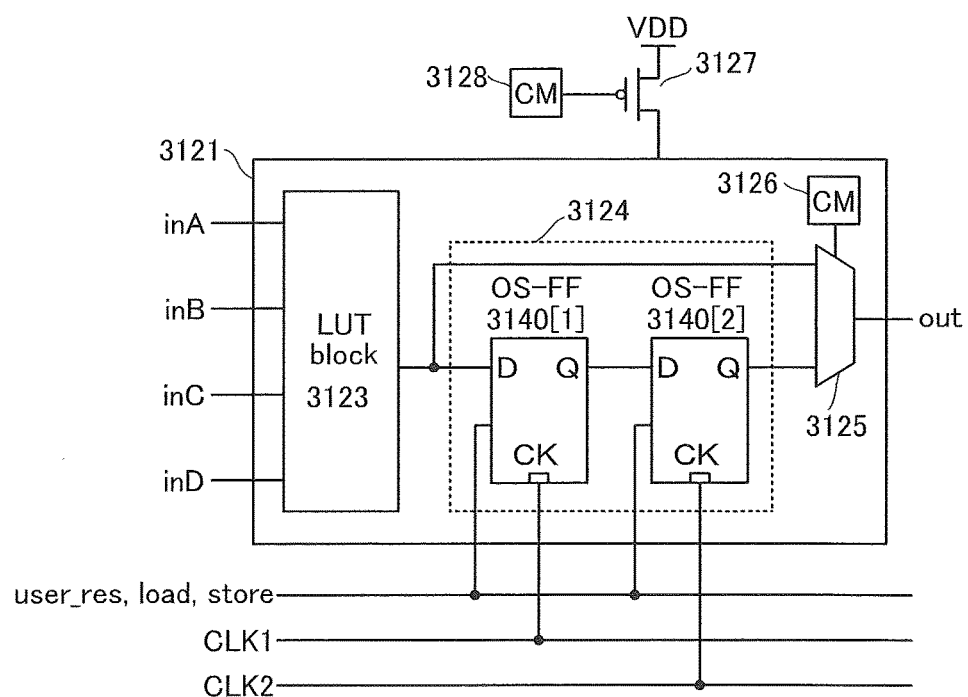
FIG. 23 is a block diagram illustrating a configuration example of a PLE.

FIG. 23 illustrates a configuration example of the PLE 3121. The PLE 3121 includes a lookup table (LUT) block 3123, a register block 3124, a selector 3125, and a CM 3126. The LUT block 3123 is configured to select and output data in the LUT block in accordance with inputs inA to inD. The selector 3125 selects an output of the LUT block 3123 or an output of the register block 3124 in accordance with the configuration data stored in the CM 3126.

The PLE 3121 is electrically connected to a power supply line for a voltage VDD through a power switch 3127. Whether the power switch 3127 is turned on or off is determined in accordance with configuration data stored in a CM 3128. Fine-grained power gating can be performed by providing the power switch 3127 for each PLE 3121. The PLE 3121 which is not used after context switching can be power gated owing to the fine-grained power gating function; thus, standby power can be effectively reduced.

The register block 3124 is formed by nonvolatile registers to achieve normally-off computing. The nonvolatile registers in the PLE 3121 are each a flip-flop provided with an OS memory (hereinafter referred to as OS-FF).

The register block 3124 includes an OS-FF 3140[1] and an OS-FF 3140[2]. A signal user_res, a signal load, and a signal store are input to the OS-FF 3140[1] and the OS-FF 3140[2]. A clock signal CLK1 is input to the OS-FF 3140[1] and a clock signal CLK2 is input to the OS-FF 3140[2].

Figure 24A:
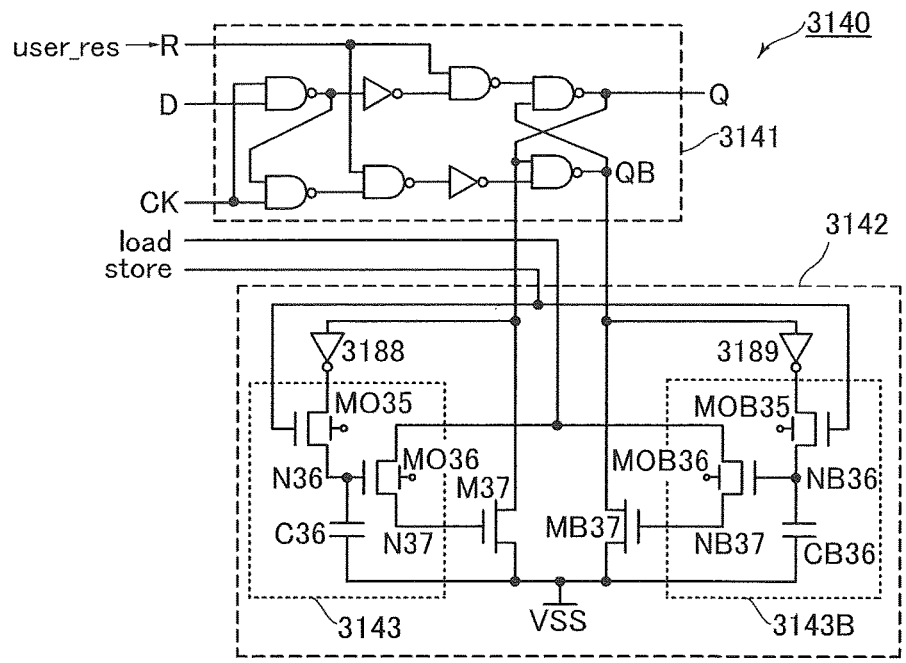
FIG. 24A is a circuit diagram illustrating a configuration example of an OS-FF.

FIG. 24A illustrates a configuration example of the OS-FF 3140. The OS-FF 3140 includes a FF 3141 and a shadow register 3142. The FF 3141 includes a node CK, a node R, a node D, a node Q, and a node QB. A clock signal is input to the node CK. The signal user_res is input to the node R. The signal user_res is a reset signal. The node D is a data input node, and the node Q is a data output node. The logics of the node Q and the node QB are complementary to each other.

The shadow register 3142 can function as a backup circuit of the FF 3141. The shadow register 3142 backs up data of the node Q and data of the node QB in response to the signal store and writes back the backed up data to the node Q and the node QB in response to the signal load.

The shadow register 3142 includes an inverter circuit 3188, an inverter circuit 3189, a Si transistor M37, a Si transistor MB37, a memory circuit 3143, and a memory circuit 3143B. The memory circuit 3143 and the memory circuit 3143B each have the same circuit configuration as the memory circuit 3137 of the PRS 3133. The memory circuit 3143 includes a capacitor C36, an OS transistor MO35, and an OS transistor MO36. The memory circuit 3143E includes a capacitor CB36, an OS transistor MOB35, and an OS transistor MOB36. A node N36 and a node NB36 correspond to a gate of the OS transistor MO36 and a gate of the OS transistor MOB36, respectively, and are each a charge retention node. A node N37 and a node NB37 correspond to a gate of the Si transistor M37 and a gate of the Si transistor MB37, respectively.

The OS transistors MO35, MO36, MOB35, and MOB36 each include a back gate, and these back gates are electrically connected to power supply lines that each supply a fixed voltage.

Figure 24B:
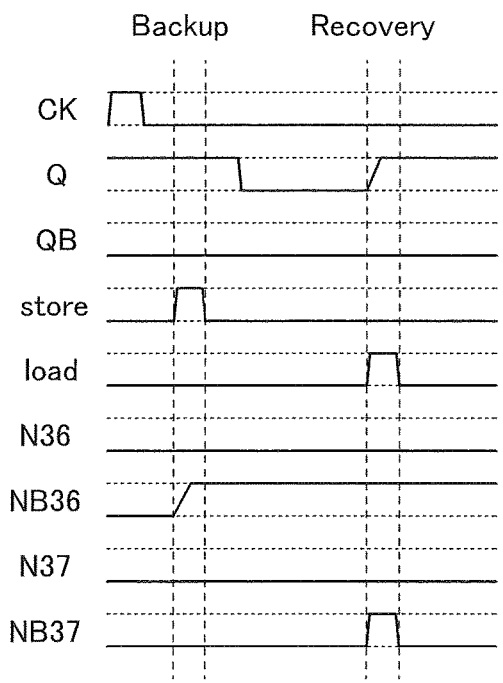
FIG. 24B is a timing chart illustrating an operation example of the OS-FF.

An example of an operation method of the OS-FF 3140 will be described with reference to FIG. 24B.

(Backup)

When the signal store at "H" is input to the OS-FF 3140, the shadow register 3142 backs up data of the FF 3141. The node N36 becomes "L" when the data of the node Q is written thereto, and the node NB36 becomes "H" when the data of the node QB is written thereto. After that, power gating is performed and the power switch 3127 is turned off. Although the data of the node Q and the data of the node QB of the FF 3141 are lost, the shadow register 3142 retains the backed up data even when power supply is stopped.

(Recovery)

The power switch 3127 is turned on to supply power to the PLE 3121. After that, when the signal load at "H" is input to the OS-FF 3140, the shadow register 3142 writes back the backed up data to the FF 3141. The node N37 is kept at "L" because the node N36 is at "L", and the node NB37 becomes "H" because the node NB36 is at "H". Thus, the node Q becomes "H" and the node QB becomes "L". That is, the OS-FF 3140 is restored to a state at the backup operation.

A combination of the fine-grained power gating and backup/recovery operation of the OS-FF 3140 allows power consumption of the OS-FPGA 3110 to be effectively reduced.

The FPGA described in this embodiment can be used for a variety of circuits in the controller IC 115 described in Embodiment 1. The controller IC 115 can effectively reduce power consumption by using the FPGA described in this embodiment.

Example 1

In this example, a display system for driving a hybrid display device was fabricated and its power consumption was examined.

Figure 25:
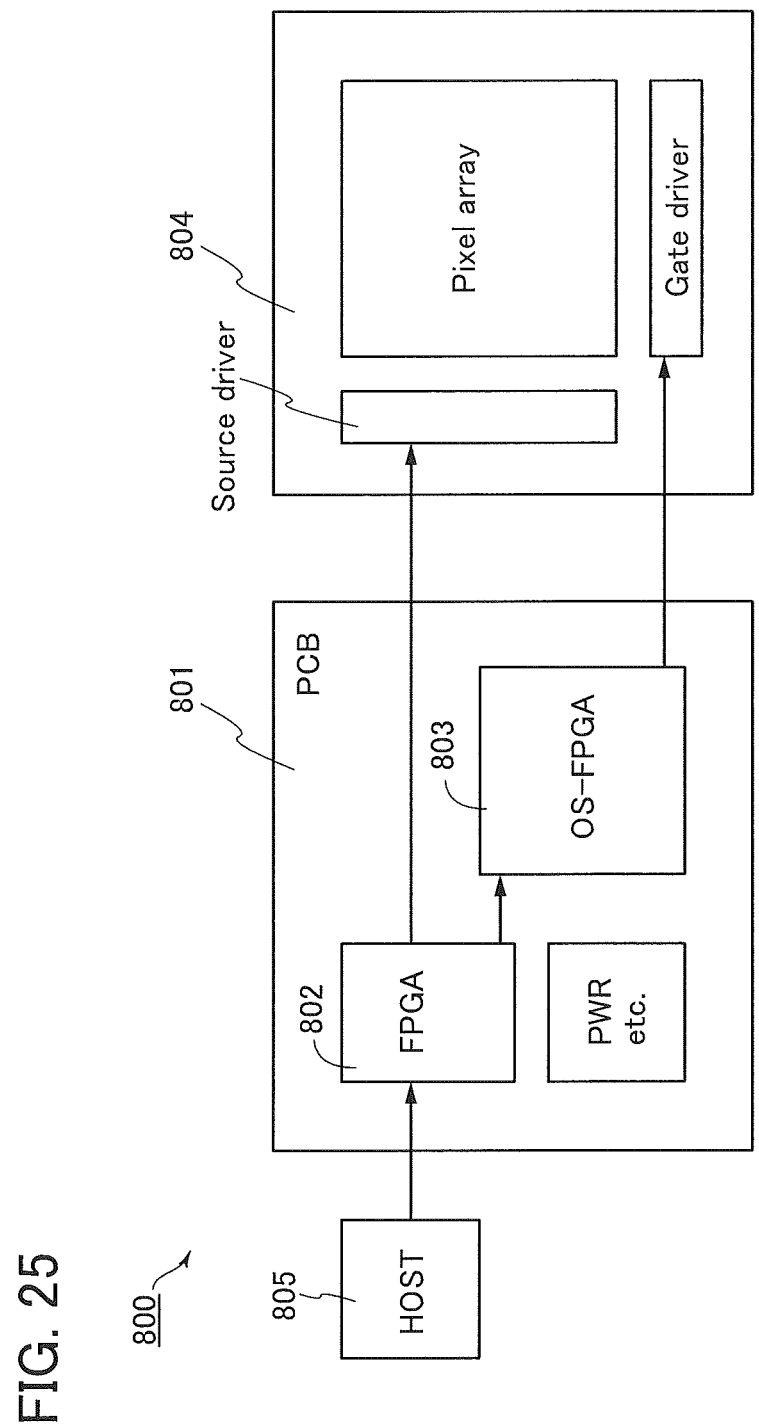
FIG. 25 is a block diagram illustrating a structure of a fabricated display system.

FIG. 25 illustrates a display system 800 fabricated in this example. In FIG. 25, an image data stream from a host 805 is converted into a desired data format by a display controller, which is constructed on a printed circuit board (PCB) 801, and is then transmitted to a display unit 804.

The display unit 804 is a hybrid display device similar to the display unit 110 in Embodiment 1 and includes a reflective liquid crystal element and an organic EL element in one pixel. The IDS driving described in the above embodiment can be performed on the display unit 804.

An FPGA 802 on the PCB 801 detects whether image data is updated or not to determine whether the display unit 804 performs normal driving (not IDS driving) or IDS driving and supplies a control signal to the display unit 804.

An OS-FPGA 803 functions as a timing controller and switches a configuration depending on a display mode. The OS-FPGA 803 is capable of power gating (PG) except when image data is updated. A power supply circuit PWR and the like are provided on the PCB 801.

Table 1 shows the specifications of the display unit 804 fabricated in this example.

TABLE 1

| | |
|---|---|
| Screen diagonal | 4.29 inches |
| Resolution | 1080 (H) × 1920 (V) |
| Pixel pitch | 49.5 μm (H) × 49.5 μm (V) |
| Pixel density | 513 ppi |
| Aperture ratio | 56.7% (reflective LCD) |
| | R: 25.6%, G: 25.2%, B: 25.1%, W: 5.7% (OLED) |
| Source driver | COG |
| Gate driver | Integrated (OS-FET) |

The features of the OS-FPGA 803 are a nonvolatile configuration memory (CM) including OS transistors, applicability of a multi-context configuration owing to a small number of elements in the CM, high-speed operation owing to the boosting effect of programmable switches, and the like. As an architecture that utilizes these features, a multi-context architecture capable of performing fine-grained PG (FG-PG) in each programmable logic element (PLE) is used. The OS-FPGA 803 also performs dynamic reconfiguration, and includes an OS transistor in each PLE register. Therefore, normally-off computing for context switching and fine-grained PG in each PLE is achieved.

In this example, part of the display controller was formed. The circuit configuration of the OS-FPGA 803 can be changed into an efficient configuration for the normal driving and the IDS driving with context switching. Moreover, PG can be performed except when image data is updated. The part of the display controller other than part constructed by the OS-FPGA 803 are constructed by the FPGA 802.

TABLE 2

| | |
|---|---|
| Technology | CMOS 65 nm 1-Poly 2-Metal |
| | OS 60 nm |
| Die size | 4 mm × 6.68 mm |
| Number of PLEs | 1000 |
| Number of CMs | 323.3 kb |
| Supply voltage | 1.2 V |
| Architecture | Multi-context (2-context) |
| | Fine-grained power gating |
| Performance | 120 MHz $F_{max}$, 0.41 mW core power consumption at 100 MHz with a 20-stage shift register |

Figure 26A:
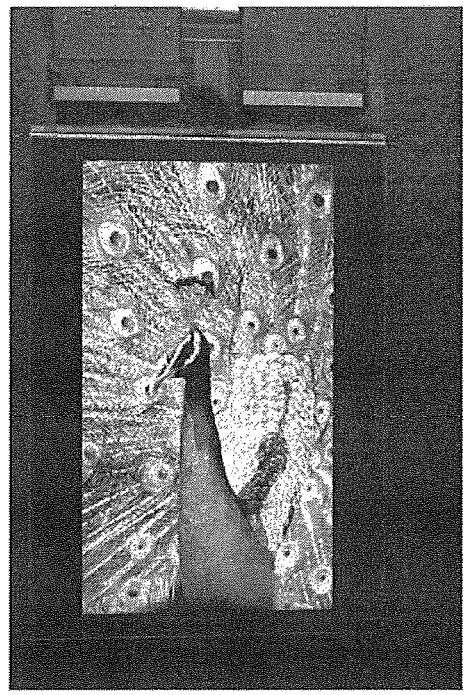
FIGS. 26A and 26B are display images of a fabricated hybrid display.
Figure 26B:
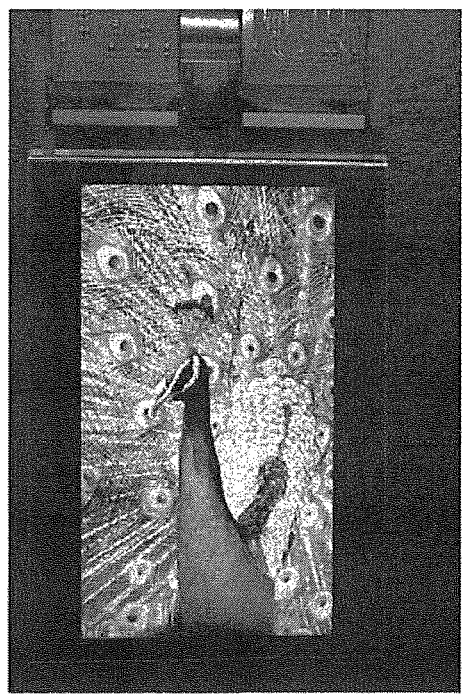

FIGS. 26A and 26B show display images of the fabricated display system 800. FIG. 26A shows an image displayed in the normal driving at a frame rate of 60 Hz, and FIG. 26B shows an image displayed in the IDS driving at a frame rate of 1/60 Hz. There is no difference in display quality when the images in FIGS. 26A and 26B are compared.

Next, Table 3 shows power consumption of the OS-FPGA 803 (converted into an average value for 60 seconds) in the normal driving and the IDS driving. Either clock gating (CG) or PG was employed to reduce power consumption in the IDS driving. The power consumption of an SRAM-FPGA fabricated with the same process technology as the OS-FPGA 803 by using an SRAM for the CM is shown in Table 3 for comparison.

TABLE 3

|  | IDS driving | | |
| --- | --- | --- | --- |
|  | Normal driving | Clock gating | Power gating |
| OS-FPGA | 272 µW | 26.5 µW | 0.08 µW |
| SRAM-FPGA | 331 µW | 104 µW | Not available |

According to the results shown in Table 3, the power consumption of the OS-FPGA and the power consumption of the SRAM-FPGA in the IDS driving (CG) were reduced by 90% and 68%, respectively, of those in the normal driving. It was found that the power consumption of the OS-FPGA in the IDS driving (PG) is reduced by more than 99.9% of that in the normal driving.

It is confirmed from this example that the display device that performs IDS driving can further reduce power consumption of the entire display system by employing the OS-FPGA.

Example 2

In this example, results of fabricating a display controller using a Si-OS hybrid process and verifying operation of a display system constructed using the fabricated display controller will be described. The display controller is capable of performing normally-off driving in accordance with IDS display and changing a parameter in real time by configuring a nonvolatile scan register with a nonvolatile register.

Figure 27:
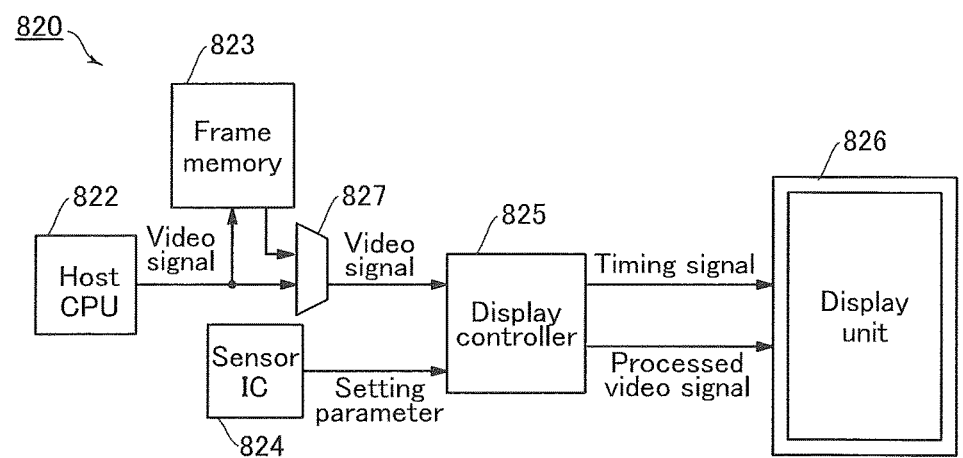
FIG. 27 is a functional block diagram of a fabricated display system.

FIG. 27 is a functional block diagram of a fabricated display system. A display system 820 includes a host CPU 822, a frame memory 823, a sensor IC 824, a display controller 825, a display unit 826, and a selector 827.

The display unit 826 is a hybrid display unit similar to the display unit 110 in Embodiment 1 and includes a reflective liquid crystal element and an organic EL element in one pixel. The host CPU 822 or the frame memory 823 transmits a video signal to the display controller 825. The selector 827 selects a video signal source. The sensor IC 824 obtains information on external light and generates a setting parameter. The setting parameter is transmitted to the display controller 825. The display controller 825 performs image processing on the video signal and generates a timing signal, on the basis of the setting parameter, to perform appropriate display in response to external light. The processed video signal and the timing signal are transmitted to the display unit 826. Thus, the lightness, color tones, and refresh rate are controlled to be appropriate in the display unit 826.

Display modes of the display system 820 are moving image display, still image display, and sleep. Table 4 shows the operations of modules of the display system 820 in each display mode.

TABLE 4

|  | External light | Host CPU 822 | Frame memory 823 | Sensor IC 824 | Display controller 825 | Display unit 826 |
| --- | --- | --- | --- | --- | --- | --- |
| Moving image display | Changed | ON | OFF | ON | ON | Normal |
|  | Not changed | ON | OFF | OFF | ON | Normal |
| Still image display | Changed | OFF | ON | ON | ON | IDS |
|  | Not changed | OFF | ON | OFF | ON | IDS |
| Sleep |  | OFF | OFF | OFF | Holding parameter | OFF |

The display unit 826 is operated by normal driving in the moving image display mode and stops operation in the sleep mode. In the still image display mode, the driving mode of the display unit 826 can be changed from the normal driving to the IDS driving by changing a timing signal from the display controller 825. During the IDS driving, the power consumption of the display unit 826 can be reduced because the refresh rate of the display unit 826 is reduced. In the still image display mode, the display unit 826 can display a still image by storing image data in the frame memory 823 and reading image data sequentially. When the external light conditions are changed, a setting parameter in response to external light after the change is transmitted from the sensor IC 824 to the display controller 825. The display controller 825 performs image processing using the updated setting parameter. Therefore, a user can use the display unit 826 with agreeable lightness and color tones. Accordingly, the power consumption can be reduced because the host CPU 822 does not need to transmit additional image data in the still image display mode.

Figure 28A:
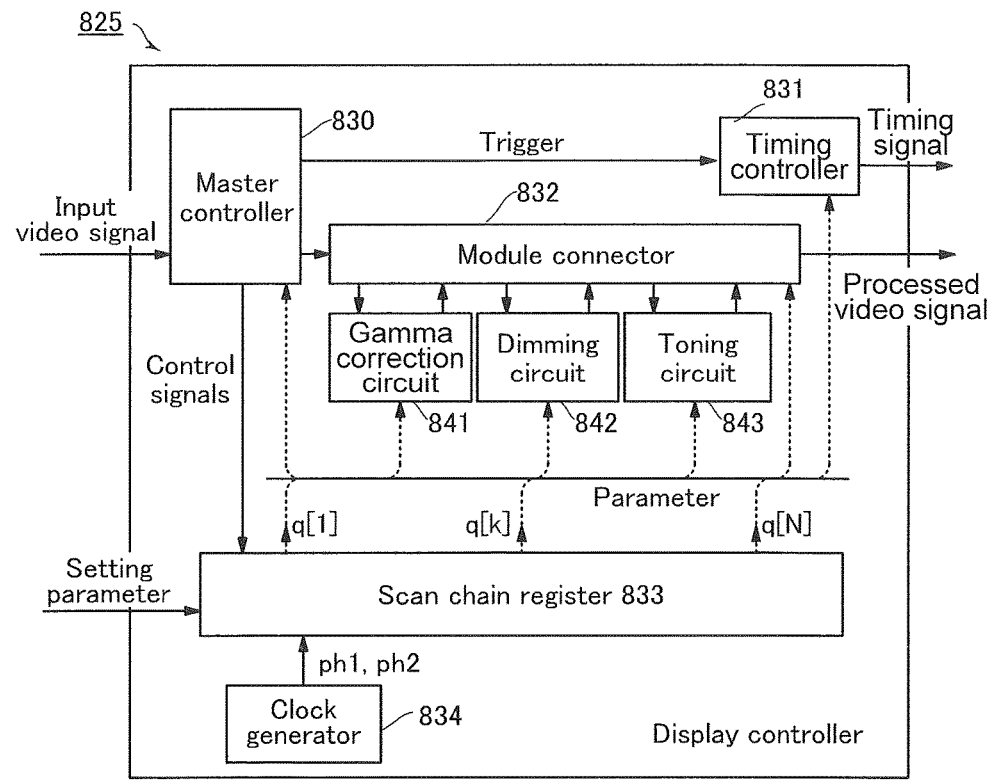
FIG. 28A is a functional block diagram of a fabricated display controller.

FIG. 28A is a functional block diagram of the fabricated display controller 825. The display controller 825 includes a master controller 830, a timing controller 831, a module connector 832, a scan chain register 833, a clock generator 834, and an image processing circuit. The master controller 830 controls modules in the display controller 825. The module connector 832 controls connection between modules. As the image processing circuits, a gamma correction circuit 841, a dimming circuit 842, and a toning circuit 843 are provided.

The video signal transmitted from the host CPU 822 is input to the module connector 832 through the master controller 830. The video signal is input to the image processing circuits 841 to 843 through the module connector 832 in an order based on the setting parameter. The modules in the display controller 825 operate on the basis of parameters in the setting register configuring the scan chain register 833.

To generate a timing signal with an input video signal as a reference, the master controller 830 outputs a trigger signal to the timing controller 831 after the video signal is input. The timing controller 831 generates a timing signal with a cycle and a pulse width based on a setting parameter, which enables control of switching between normal driving and IDS driving and control of the refresh rate in IDS driving. A timing signal in accordance with the resolution of the display unit 826 can be generated using the setting parameter.

The gamma correction circuit 841 employs a method to express a gamma curve ($Y=X^{(1/\gamma)}$), with approximate lines $Y=a_n X+b_n (X_{n-1} \leq X < X_n)$. Note that $a_n$, $b_n$, and $X_n$ are setting parameters. As compared with a configuration including a lookup table for gamma correction, the number of the setting registers to store gamma correction parameters can be reduced. The dimming circuit 842 adjusts the luminance of an organic EL element with respect to the illuminance of external light. The luminance of the organic EL element can be changed by a setting parameter, so that low power consumption and high display quality can be achieved at the same time. The toning circuit 843 adjusts color tones of the display unit 826 in accordance with user preference by changing a setting parameter.

Figure 28B:
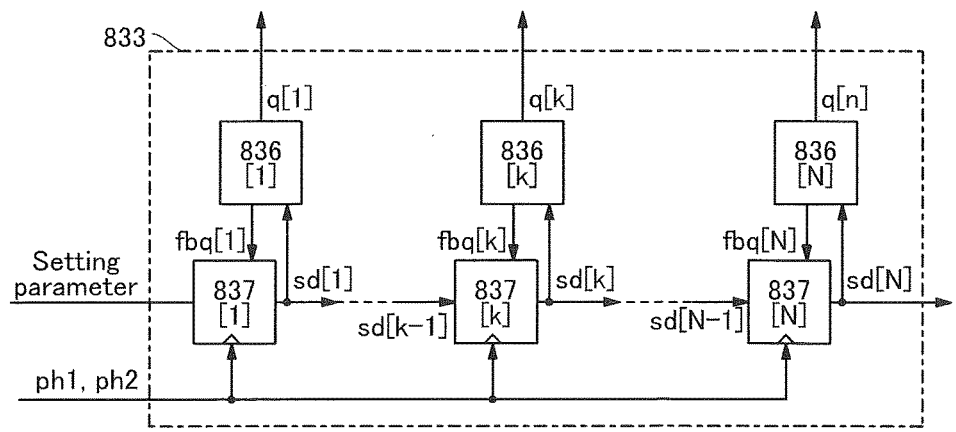
FIG. 28B is a functional block diagram of a scan chain register.

FIG. 28B is a functional block diagram of the scan chain register 833. The scan chain register 833 includes N (N is an integer greater than or equal to 2) Si-REGs 836 and N OS-REGs 837. The scan chain register 833 includes a Si-REG 836 and an OS-REG 837 as a unit. The Si-REG 836 is a volatile register consisting of a Si transistor. The OS-REG 837 is a register consisting of an OS transistor and a Si transistor. The OS-REG 837 is a nonvolatile register which does not lose data even when power supply is stopped.

Setting parameters are input from the sensor IC 824 to the scan chain register 833 and are written to the OS-REG 837 in each stage in synchronization with clocks signals ph1 and ph2. Simply updating the setting parameters of the OS-REG 837 is not reflected in the operation of the modules in the display controller 825. Output data sd[k] (k is an integer of 1 to N) of the OS-REGs 837[k] are collectively taken in Si-REGs 836[k] by a control signal from the master controller 830 so that output data q[k] of the Si-REGs 836[k] are collectively updated.

All data q[k] can be simultaneously updated; therefore, display of the display unit 826 is not disturbed even when the setting parameters are written to the scan chain register 833 at low speed. Hence, the display controller 825 offers the advantage of not requiring high-speed communication with the sensor IC 824; in other words, the communication can be performed with low power consumption.

Figure 29A:
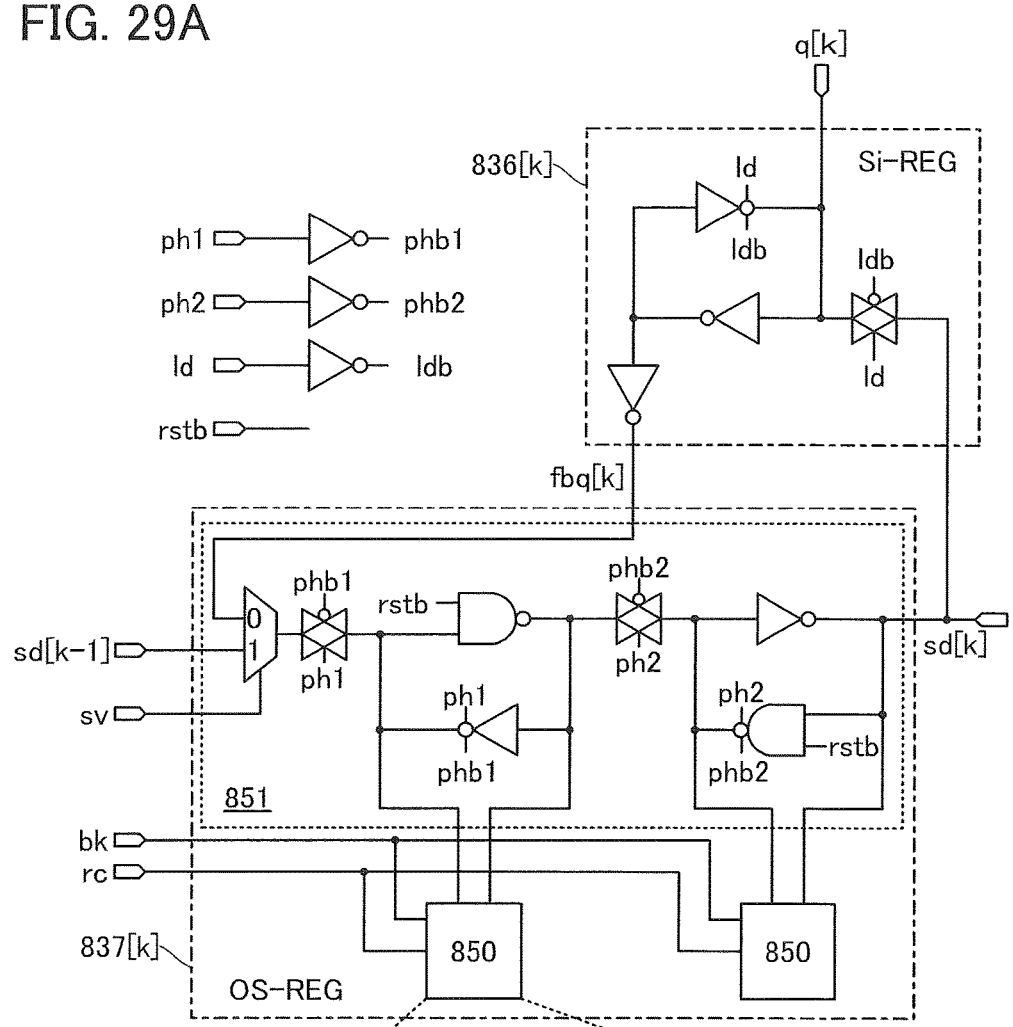
FIG. 29A is a circuit diagram of a register included in a scan chain register.

FIG. 29A is a circuit diagram of the Si-REG 836[k] and the OS-REG 837[k]. A signal ld, a signal sv, a signal bk, a signal rc, and a signal rstb are control signals transmitted from the master controller 830. The signal ld is a load signal, the signal sv is a save signal, the signal bk is a backup signal, the signal rc is a recovery signal, and the signal rstb is a reset signal.

Figure 29B:
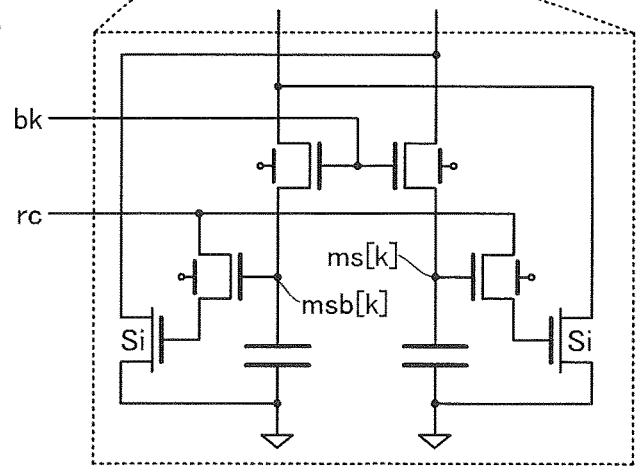
FIG. 29B is a circuit diagram of a backup circuit.

Here, output data fbq[k] of the Si-REG 836[k] has the same logic as the output data sd[k] of the OS-REG 837[k]. The OS-REG 837[k] includes two backup circuits 850 and a scan flip-flop 851 consisting of a Si transistor. FIG. 29B is a circuit diagram of the backup circuit 850. The backup circuit 850 includes a retention node ms[k] and a retention node msb[k]. A transistor with an indication of "Si" is a Si transistor. A transistor having a back gate is an OS transistor. A fixed potential is input to the back gate.

Figure 30:
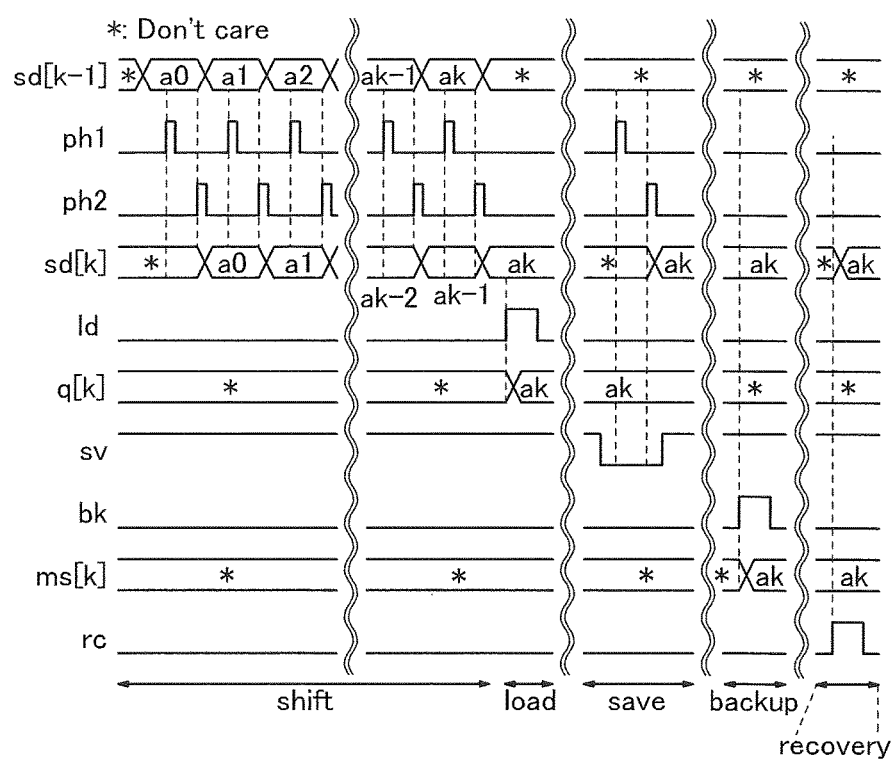
FIG. 30 is a timing chart of a scan chain register.

FIG. 30 is a timing chart showing operation of the scan chain register 833. In FIG. 30, a0, a1, and the like represent the logics of data.

(Shift operation) To write a setting parameter to the OS-REG 837[k], the scan flip-flop 851 is used. In the scan chain register 833, N scan flip-flops 851 are connected in series to form a scan chain. The data of the scan flip-flop 851 in each stage is updated by performing shift operation in synchronization with the clock signals ph1 and ph2.

(Load operation) The data sd[k] is written to the Si-REG 836[k] by setting the signal ld at "H". Here, the data q[k] is updated to "ak" because "ak" is written to the Si-REG 836[k].

(Save operation) The data fbq[k] output from the Si-REG 836[k] becomes input data of the scan flip-flop 851 by setting the signal sv at "L". The data fbq[k] (="ak") is written to the OS-REG 837[k] in synchronization with the rising of the clock signal ph1; thus, the logic of the data sd[k] becomes "ak".

(Backup operation) The logic value of an inverter loop of the scan flip-flop 851 is written to the retention node ms[k] and the retention node msb[k] of the backup circuit 850 by setting the signal bk at "H". Charges of the retention node ms[k] and the retention node msb[k] are retained in an OS transistor having a thick gate insulating layer and thus have less influence of gate leakage current.

(Recovery operation) Data stored in the backup circuit 850 is written back to the scan flip-flop 851 by setting the signal rc at "H". Data can be written back to the scan flip-flop 851 at high speed because a Si transistor having high mobility is used as a pass gate in the backup circuit 850.

Next, the data written back to the scan flip-flop 851 by the recovery operation can be loaded again in the Si-REG 836[k] by performing the above load operation. In the example of FIG. 30, the logic of the data q[k] becomes again "ak" by performing the load operation.

Therefore, by performing the recovery operation and the load operation, the display controller 825 can be restored to a state in which a setting parameter when the power supply is stopped can be used even when power gating is performed. In other words, a series of operations of transmitting a setting parameter from the sensor IC 824 and writing the setting parameter to the scan chain register 833 at every restart of the display controller 825 is not necessary; thus, power consumption and time required for the restart can be significantly reduced.

Thus, the display controller 825 can stop power supply and perform restart or restore in accordance with IDS driving of the display unit 826 by including the scan chain register 833.

<Fabricated Chip>

Figure 31:
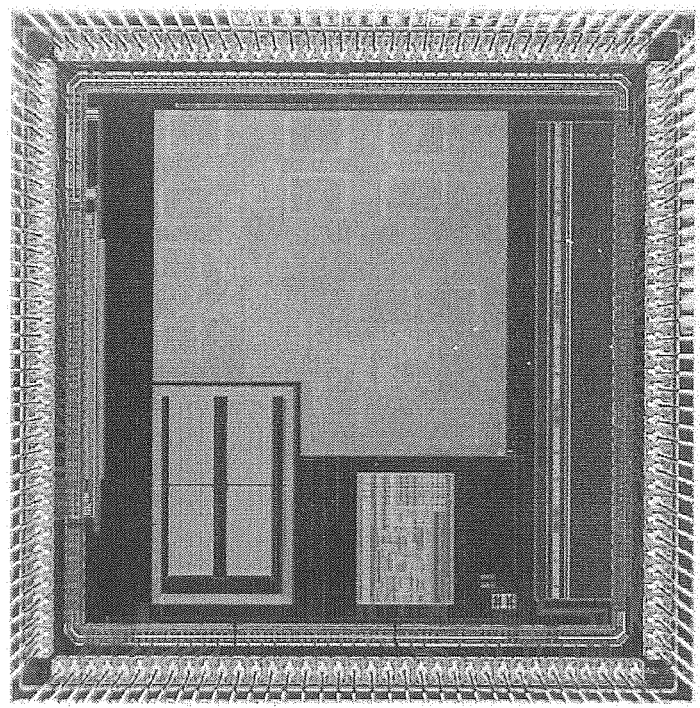
FIG. 31 is a micrograph of a chip of a fabricated display controller.

The display controller 825 was fabricated using a hybrid process of a Si transistor having a gate length of 65 nm and an OS transistor having a gate length of 60 nm. FIG. 31 is a micrograph of a die of the display controller 825. Table 5 shows the specifications of the display controller 825.

TABLE 5

| | |
|---|---|
| Technology | CMOS 65 nm |
| | OS 60 nm |
| Die size | 3.0 mm × 3.0 mm |
| Number of Pads | 144 |
| Number of Gates | 150k |
| Number of Scan register | 5742 bits |
| Memories SRAM | 340k bits |
| Video data I/F | LVDS |
| Clock | 20 MHz (internal PLL reference) |
| | 300 MHz (LVDS RX/TX) |
| | 1 GHz (internal PLL) |
| Power supply | 3.3 V, 1.2 V, 0 V-4 V |
| | (OS Transistor backgate) |

The operation of the display system 820 was verified. The number of pixels of the display unit 826 was 1920×1080. In the still image display mode, controllability of switching between normal driving and IDS driving was confirmed by changing a setting parameter, which allows a still image to be displayed even in IDS driving with display quality equivalent to that obtained with normal driving.

Table 6 shows measurement results of power consumption of the display controller 825 and the display unit 826 in the still mage display mode.

TABLE 6

| | Normal driving | IDS driving |
|---|---|---|
| Power consumed by display controller (W) | 0.309 | 0.077 |
| Power consumed by hybrid display (W) | 0.958 | 0.814 |
| Total (W) | 1.267 | 0.891 |
| Rate (%) | 100 | 70.3 |

It is found from the measurement results in Table 6 that the display controller 825 can significantly reduce power consumption in IDS driving and the total power consumption of the display unit 826 and the display controller 825 can be reduced by about 30% by IDS driving.

REFERENCE NUMERALS

ACF1: conductive material, ACF2: conductive material, AF1: alignment film, AF2: alignment film, C1: arrow, C2: arrow, C4: capacitor, C6: capacitor, C11: capacitor, C12: capacitor, C31: capacitor, C36: capacitor, CB31: capacitor, CB36: capacitor, CF1: coloring film, CF2: coloring film, CLK1: clock signal, CLK2: clock signal, CS1: capacitor, G1: scan line, G2: scan line, KB1: structure body, LOAD1: signal, LOAD2: signal, M31: Si transistor, M37: Si transistor, MO31: OS transistor, MO32: OS transistor, MO35: OS transistor, MO36: OS transistor, MOB31: OS transistor, MOB32: OS transistor, MOB35: OS transistor, MOB36: OS transistor, MW1: transistor, N31: node, N32: node, N36: node, N37: node, NB32: node, NB36: node, NB37: node, ph1: clock signal, ph2: clock signal, PWR: power supply circuit, R1: arrow, R2: arrow, S1: signal line, S2: signal line, SAVE2: signal, SD1: source driver, SD2: source driver, SW1: switch, SW2: switch, T1: transistor, T2: transistor, T6: transistor, VCOM1: wiring, VCOM2: wiring, 10: pixel, 10a: reflective element, 10b: light-emitting element, 17: retention circuit, 18: selector, 19: flip-flop circuit, 20: inverter, 25: inverter, 27: analog switch, 28: analog switch, 31: inverter, 33: inverter, 34: clocked inverter, 35: analog switch, 36: buffer, 100: display device, 110: display unit, 111: pixel array, 113: gate driver, 114: gate driver, 115: controller IC, 117: controller IC, 120: touch sensor unit, 121: sensor array, 125: peripheral circuit, 126: TS driver, 127: sensor circuit, 140: host, 143: optical sensor, 144: open/close sensor, 145: external light, 150: interface, 151: frame memory, 152: decoder, 153: sensor controller, 154: controller, 155: clock generation circuit, 160: image processing portion, 161: gamma correction circuit, 162: dimming circuit, 163: toning circuit, 164: EL correction circuit, 170: memory, 173: timing controller, 175: register, 175A: scan chain register portion, 175B: register portion, 180: source driver, 181: source driver, 182: source driver, 184: touch sensor controller, 186: source driver IC, 190: region, 191: region, 202: control portion, 203: cell array, 204: sense amplifier circuit, 205: driver, 206: main amplifier, 207: input/output circuit, 208: peripheral circuit, 209: memory cell, 230: register, 231: register, 501A: insulating film, 501C: insulating film, 504: conductive film, 505: bonding layer, 506: insulating film, 508: oxide semiconductor film, 508A: region, 508B: region, 508C: region, 511B: conductive film, 511C: conductive film, 511D: conductive film, 512A: conductive film, 512B: conductive film, 516: insulating film, 518: insulating film, 519B: terminal, 519C: terminal, 519D: terminal, 521: insulating film, 524: conductive film, 528: insulating film, 551: electrode, 552: electrode, 553: layer, 570: substrate, 702: pixel, 705: sealant, 720: functional layer, 751: electrode, 751E: region, 751H: opening, 752: electrode, 753: layer, 754A: intermediate film, 754B: intermediate film, 754C: intermediate film, 754D: intermediate film, 770: substrate, 770D: functional film, 770P: functional film, 771: insulating film, 775: sensing element, 800: display system, 801: PCB, 802: FPGA, 803: OS-FPGA, 804: display unit, 805: host, 820: display system, 822: host CPU, 823: frame memory, 824: sensor IC, 825: display controller, 826: display unit, 827: selector, 830: master controller, 831: timing controller, 832: module connector, 833: scan chain register, 834: clock generator, 836: Si-REG, 837: OS-REG, 841: gamma correction circuit, 842: dimming circuit, 843: toning circuit, 850: backup circuit, 851: scan flip-flop, 3110: OS-FPGA, 3111: controller, 3112: word driver, 3113: data driver, 3115: programmable area, 3117: JOB, 3119: core, 3120: LAB, 3121: PLE, 3123: LUT block, 3124: register block, 3125: selector, 3126: CM, 3127: power switch, 3128: CM, 3130: SAB, 3131: SB, 3133: PRS, 3135: CM, 3137: memory circuit, 3137B: memory circuit, 3140: OS-FF, 3141: FF, 3142: shadow register, 3143: memory circuit, 3143B: memory circuit, 3188: inverter circuit, 3189: inverter circuit, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display panel, 7305: icon, 7306: icon, 7311: operation button, 7312: operation button, 7313: connection terminal, 7321: band, and 7322: clasp.

This application is based on Japanese Patent Application serial no. 2016-101813 filed with Japan Patent Office on May 20, 2016 and Japanese Patent Application serial no. 2016-237312 filed with Japan Patent Office on Dec. 7, 2016, the entire contents of which are hereby incorporated by reference.

The invention claimed is:

1. A semiconductor device comprising:
a first controller;
a scan chain register portion;
a plurality of registers;
a frame memory; and
an image processing portion,
wherein the frame memory is configured to store image data,
wherein the image processing portion is configured to process the image data,
wherein the plurality of registers is configured to read data stored in the scan chain register portion at the same time,
wherein the plurality of registers is configured to store the data as a parameter for performing processing in the image processing portion,
wherein the frame memory is configured to retain the image data while power supply to the frame memory is stopped,
wherein the scan chain register portion is configured to retain the data while power supply to the scan chain register portion is stopped, and
wherein the first controller is configured to control power supply to the scan chain register portion, the plurality of registers, the frame memory, and the image processing portion.

2. The semiconductor device according to claim 1,
wherein the plurality of registers comprises:
a first register; and
a second register; and
wherein the scan chain register portion comprises:
a third register; and
a fourth register,
wherein an output terminal of the third register is electrically connected to an input terminal of the fourth register,
wherein the first register is configured to read the data stored in the third register,
wherein the second register is configured to read the data stored in the fourth register, wherein the data read by the first register and the second register are output to the image processing portion as the parameter, wherein the third register comprises a first retention circuit configured to store the data stored in the third register, wherein the fourth register comprises a second retention circuit configured to store the data stored in the fourth register, wherein the third register is configured to read the data stored in the first retention circuit, wherein the fourth register is configured to read the data stored in the second retention circuit, and wherein the first retention circuit and the second retention circuit are configured to retain the data while power supply to the scan chain register portion is stopped.

3. The semiconductor device according to claim 2, wherein the first retention circuit comprises a first transistor and a first capacitor, wherein the second retention circuit comprises a second transistor and a second capacitor, wherein the first transistor controls charge and discharge of the first capacitor, wherein the second transistor controls charge and discharge of the second capacitor, and wherein the first transistor and the second transistor each comprise an oxide semiconductor in a channel formation region.

4. The semiconductor device according to claim 1, wherein the frame memory comprises memory cells, wherein the memory cells each comprise:

a third transistor; and a third capacitor, wherein the third transistor controls charge and discharge of the third capacitor, and wherein the third transistor comprises an oxide semiconductor in a channel formation region.

5. The semiconductor device according to claim 1, further comprising:

a second controller, wherein the second controller is configured to generate a timing signal, and wherein the plurality of registers is configured to store a parameter for generating the timing signal of the second controller.

6. The semiconductor device according to claim 5, wherein the first controller is configured to control power supply to the second controller.

7. The semiconductor device according to claim 1, further comprising:

a third controller, wherein the third controller is configured to receive a first signal from an optical sensor and to generate a second signal for performing processing in the image processing portion on a basis of the first signal.

8. The semiconductor device according to claim 1, wherein when image data and a parameter are not input from an external device, the semiconductor device is configured to generate a third signal for displaying a still image on a basis of the image data stored in the frame memory and the parameter stored in the plurality of registers.

9. The semiconductor device according to claim 1, further comprising:

a source driver, wherein the source driver is configured to generate a data signal on a basis of the image data processed in the image processing portion.

10. The semiconductor device according to claim 9, wherein the first controller is configured to control power supply to the source driver.

11. The semiconductor device according to claim 1, further comprising:

a source driver, wherein the source driver is configured to generate a first data signal or a second data signal on a basis of the image data processed in the image processing portion, wherein the first data signal is configured to drive a reflective element, and wherein the second data signal is configured to drive a light-emitting element.

12. The semiconductor device according to claim 11, wherein the first controller is configured to control power supply to the source driver.

13. A semiconductor device comprising:

a scan chain register portion;

a plurality of registers;

an image processing portion;

a controller electrically connected to the scan chain register portion and the image processing portion;

a frame memory;

a source driver electrically connected to the frame memory through the image processing portion; and a pixel array electrically connected to the source driver, wherein the frame memory comprises a memory comprising a first transistor comprising an oxide semiconductor in a channel formation region, wherein the plurality of registers is configured to read data stored in the scan chain register portion at the same time, wherein the scan chain register portion comprising a retention circuit comprising a second transistor comprising an oxide semiconductor in a channel formation region, and wherein the plurality of registers is configured to store the data as a parameter for performing processing in the image processing portion.

14. The semiconductor device according to claim 13, further comprising:

a timing controller, wherein the plurality of registers is electrically connected to the source driver through the timing controller.

15. The semiconductor device according to claim 13, further comprising:

a sensor controller, wherein the image processing portion is electrically connected to an optical sensor through the sensor controller.

16. The semiconductor device according to claim 13, wherein when image data and a parameter are not input from an external device, the semiconductor device is configured to generate a signal for displaying a still image on a basis of the image data stored in the frame memory and the parameter stored in the plurality of registers.

17. The semiconductor device according to claim 13, wherein the source driver is electrically connected to a reflective element and a light-emitting element.

* * * * *